(12) United States Patent
Sugisawa et al.

(10) Patent No.: US 11,329,122 B2
(45) Date of Patent: May 10, 2022

(54) DISPLAY PANEL, DISPLAY DEVICE, DISPLAY MODULE, AND ELECTRONIC DEVICE HAVING AUXILIARY WIRING CONNECTED TO COMMON ELECTRODE

(71) Applicant: SEMICONDUCTOR ENERGY LABORATORY CO., LTD., Atsugi (JP)

(72) Inventors: Nozomu Sugisawa, Kanagawa (JP); Daiki Nakamura, Kanagawa (JP); Tomoya Aoyama, Kanagawa (JP); Yusuke Nishido, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 16/628,272

(22) PCT Filed: Jul. 26, 2018

(86) PCT No.: PCT/IB2018/055577
§ 371 (c)(1),
(2) Date: Jan. 3, 2020

(87) PCT Pub. No.: WO2019/025910
PCT Pub. Date: Feb. 7, 2019

(65) Prior Publication Data
US 2020/0161409 A1 May 21, 2020

(30) Foreign Application Priority Data
Aug. 4, 2017 (JP) .............................. JP2017-151255
Apr. 2, 2018 (JP) .............................. JP2018-070647

(51) Int. Cl.
*H01L 27/32* (2006.01)
*H01L 51/52* (2006.01)

(52) U.S. Cl.
CPC ...... *H01L 27/3279* (2013.01); *H01L 27/3258* (2013.01); *H01L 51/5253* (2013.01)

(58) Field of Classification Search
CPC ............. H01L 27/3279; H01L 27/3258; H01L 51/5253
See application file for complete search history.

(56) References Cited

U.S. PATENT DOCUMENTS 9,088,006 B2   7/2015  Yamazaki et al.
9,627,648 B2   4/2017  Yamazaki et al.
(Continued)

FOREIGN PATENT DOCUMENTS

CN    101859876 A    10/2010
CN    102856505 A     1/2013
(Continued)

OTHER PUBLICATIONS

International Search Reportt (Application No. PCT/IB2018/055577) dated Nov. 27, 2018.
(Continued)

*Primary Examiner* — Lex H Malsawma
(74) *Attorney, Agent, or Firm* — Nixon Peabody LLP; Jeffrey L. Costellia

(57) ABSTRACT

A display panel or a display device with high display quality is provided. The display panel includes a light-emitting element, an insulating layer, a protective layer, and a conductive layer. The light-emitting element includes a first electrode, a light-emitting layer, and a second electrode. The light-emitting element emits light to the protective layer side. The insulating layer includes a first opening overlapping with the first electrode. The insulating layer covers an end portion of the first electrode. The light-emitting layer overlaps with the first electrode through the first opening. The second electrode is positioned over the light-emitting (Continued)

layer. The protective layer is over and in contact with the second electrode. The protective layer functions as a protective layer of the light-emitting element. The protective layer includes a second opening overlapping with the insulating layer. The conductive layer is connected to the second electrode through the second opening. The conductive layer functions as an auxiliary wiring of the second electrode.

20 Claims, 17 Drawing Sheets

(56) References Cited

U.S. PATENT DOCUMENTS

| | | | |
|---|---|---|---|
| 2001/0011868 A1* | 8/2001 | Fukunaga | H01L 27/1288 |
| | | | 313/506 |
| 2010/0078627 A1* | 4/2010 | Yoshinaga | H01L 27/3246 |
| | | | 257/40 |
| 2010/0097295 A1* | 4/2010 | Kwak | H01L 51/5284 |
| | | | 345/32 |
| 2010/0253215 A1 | 10/2010 | Fukagawa et al. | |
| 2012/0313099 A1 | 12/2012 | Chung et al. | |
| 2014/0159002 A1 | 6/2014 | Lee et al. | |
| 2016/0035803 A1* | 2/2016 | Kim | H01L 27/326 |
| | | | 257/40 |
| 2016/0276619 A1* | 9/2016 | Cheng | H01L 51/56 |
| 2017/0047545 A1* | 2/2017 | Kwak | H01L 51/5237 |
| 2017/0154947 A1* | 6/2017 | Nakamura | H01L 27/3293 |
| 2017/0279081 A1 | 9/2017 | Yamazaki et al. | |

FOREIGN PATENT DOCUMENTS

| | | |
|---|---|---|
| CN | 103872078 A | 6/2014 |
| DE | 102013113462 | 6/2014 |
| EP | 2530717 A | 12/2012 |
| JP | 2008-098148 A | 4/2008 |
| JP | 2010-257957 A | 11/2010 |
| JP | 2012-253015 A | 12/2012 |
| JP | 2014-197522 A | 10/2014 |
| JP | 2017-211630 A | 11/2017 |
| KR | 2010-0109867 A | 10/2010 |
| KR | 2012-0134464 A | 12/2012 |
| KR | 2014-0074037 A | 6/2014 |
| KR | 2015-0010037 A | 1/2015 |
| KR | 2017-0063378 A | 6/2017 |
| TW | 201108849 | 3/2011 |
| TW | 201251003 | 12/2012 |
| TW | 201424079 | 6/2014 |
| WO | WO-2008/032845 | 3/2008 |

OTHER PUBLICATIONS

Written Opinion (Application No. PCT/IB2018/055577) dated Nov. 27, 2018.

* cited by examiner

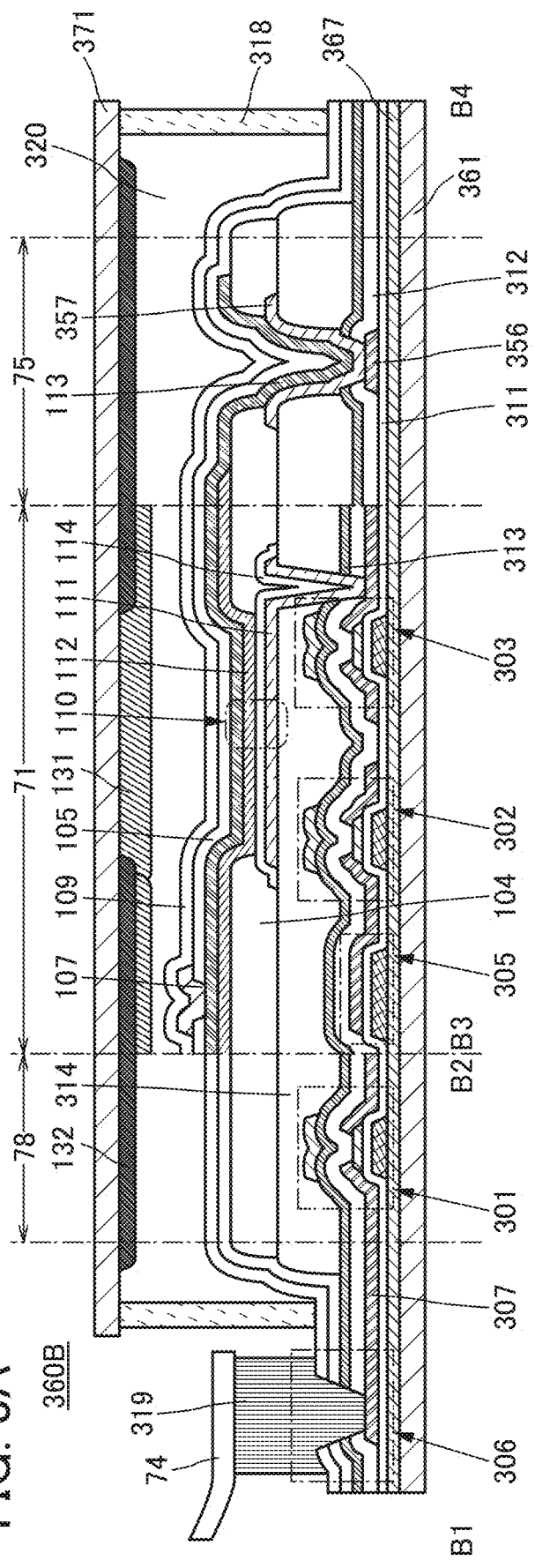
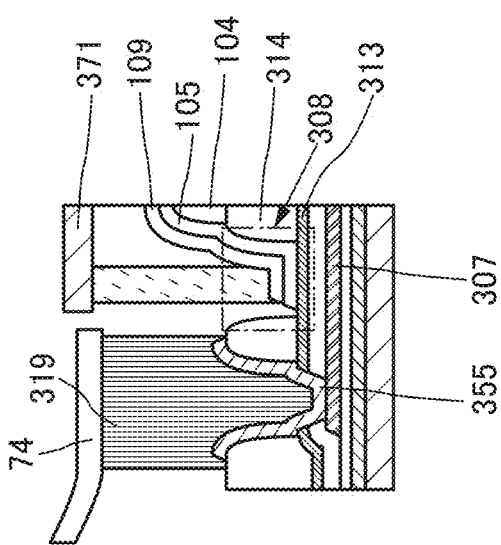
FIG. 3A
FIG. 3B

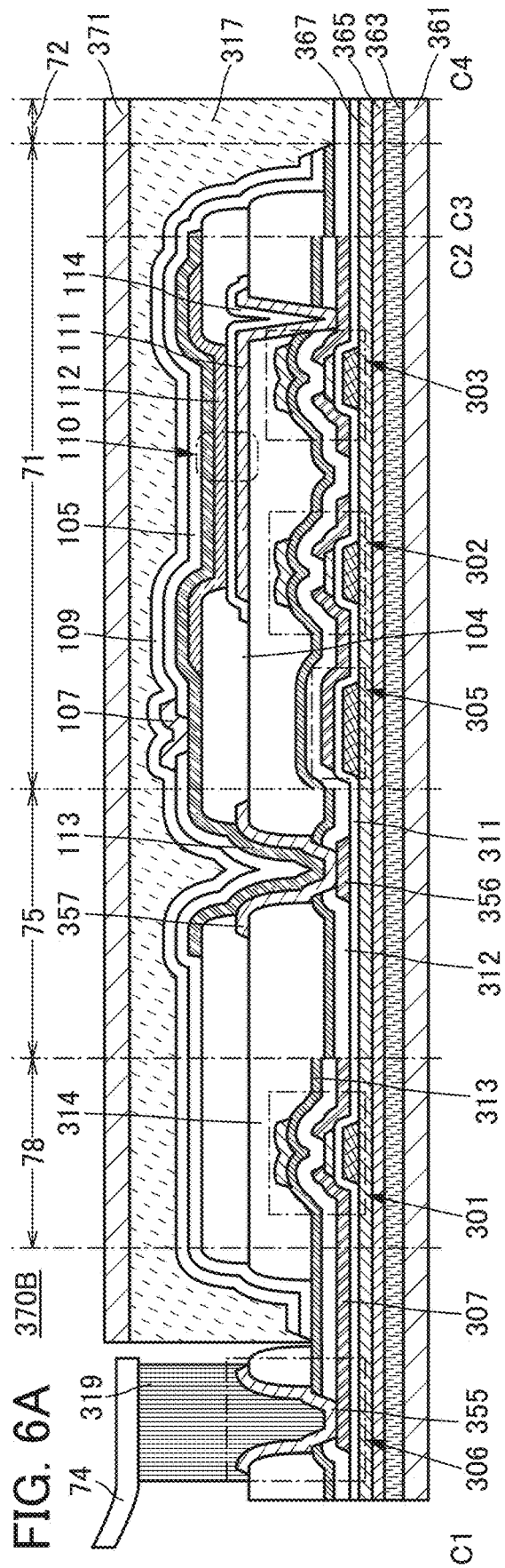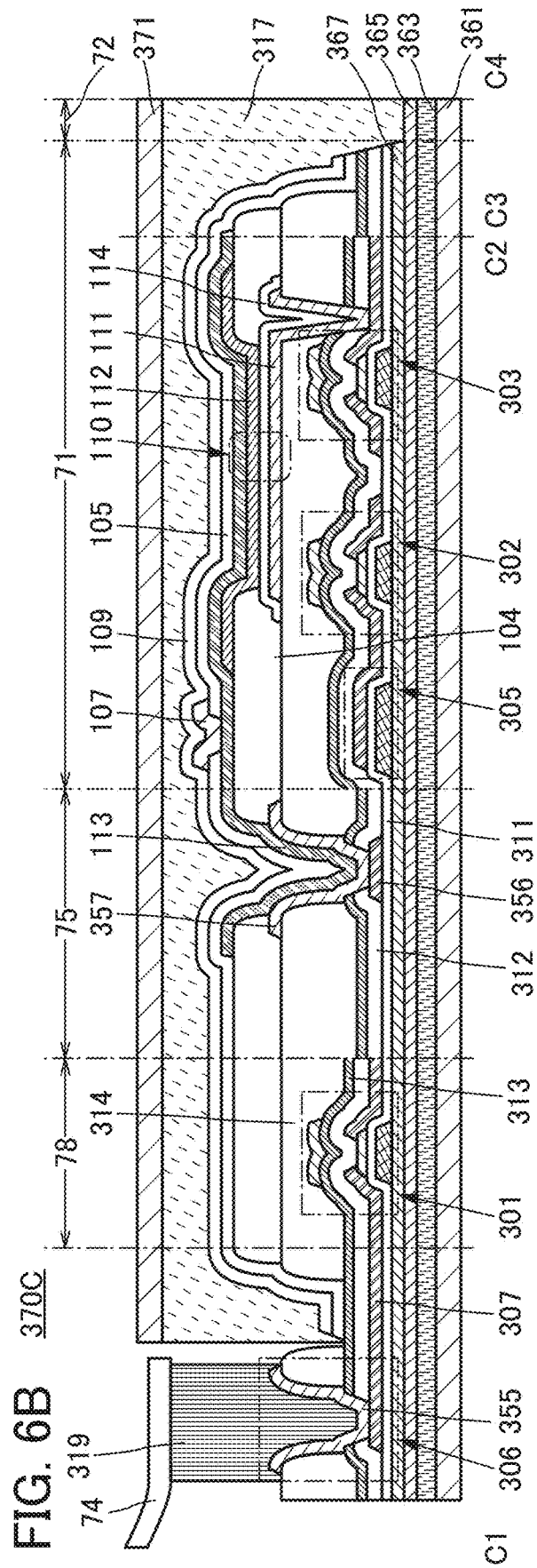

FIG. 7A1
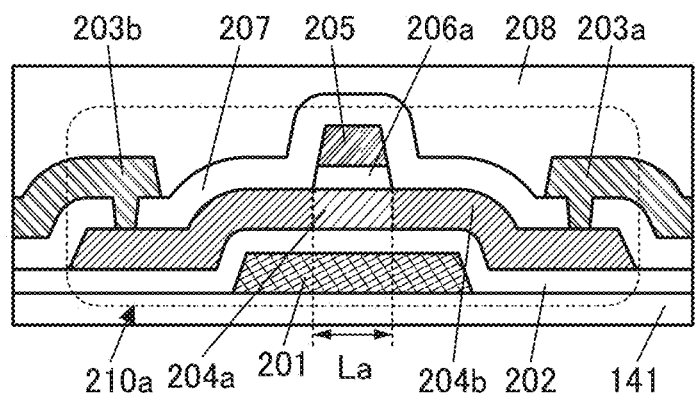
FIG. 7A2
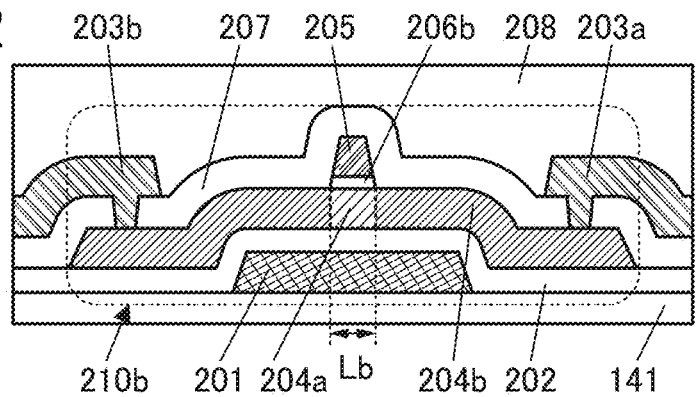
FIG. 7B
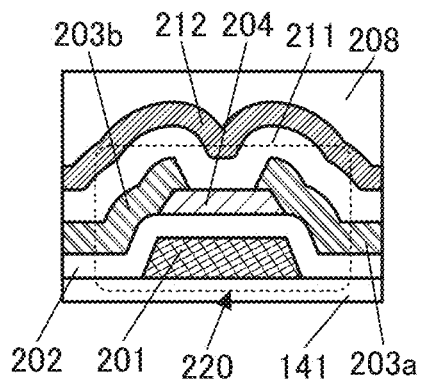
FIG. 7C
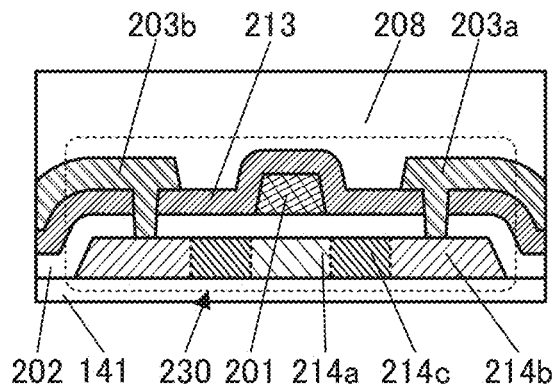
FIG. 7D
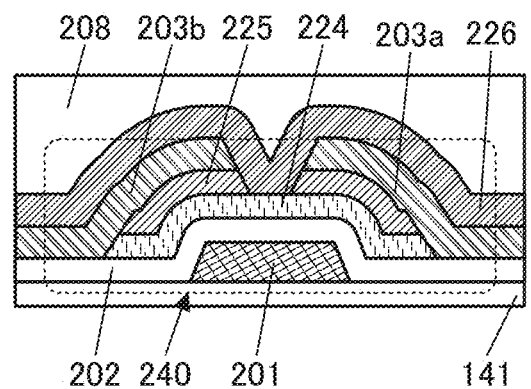

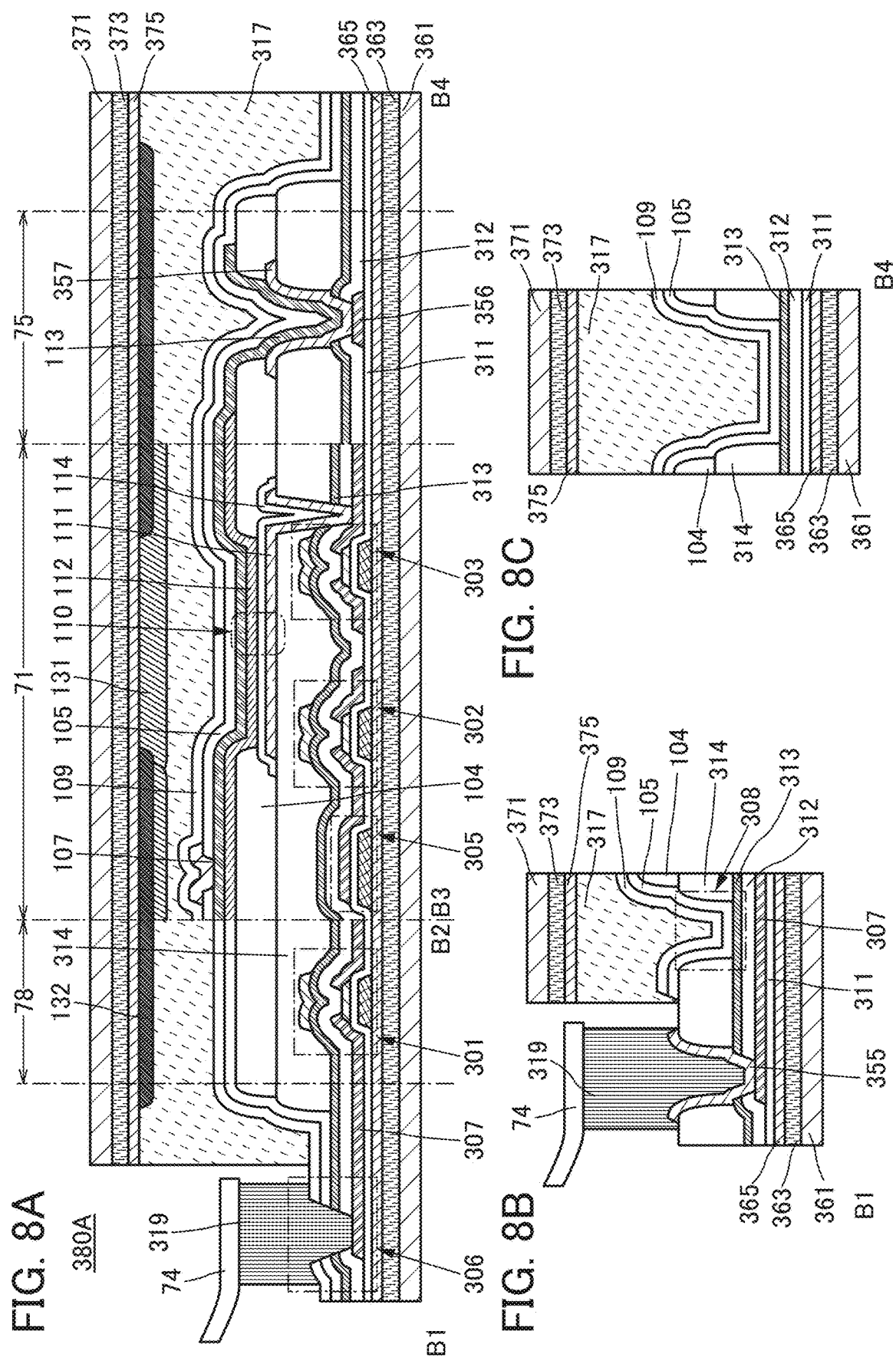

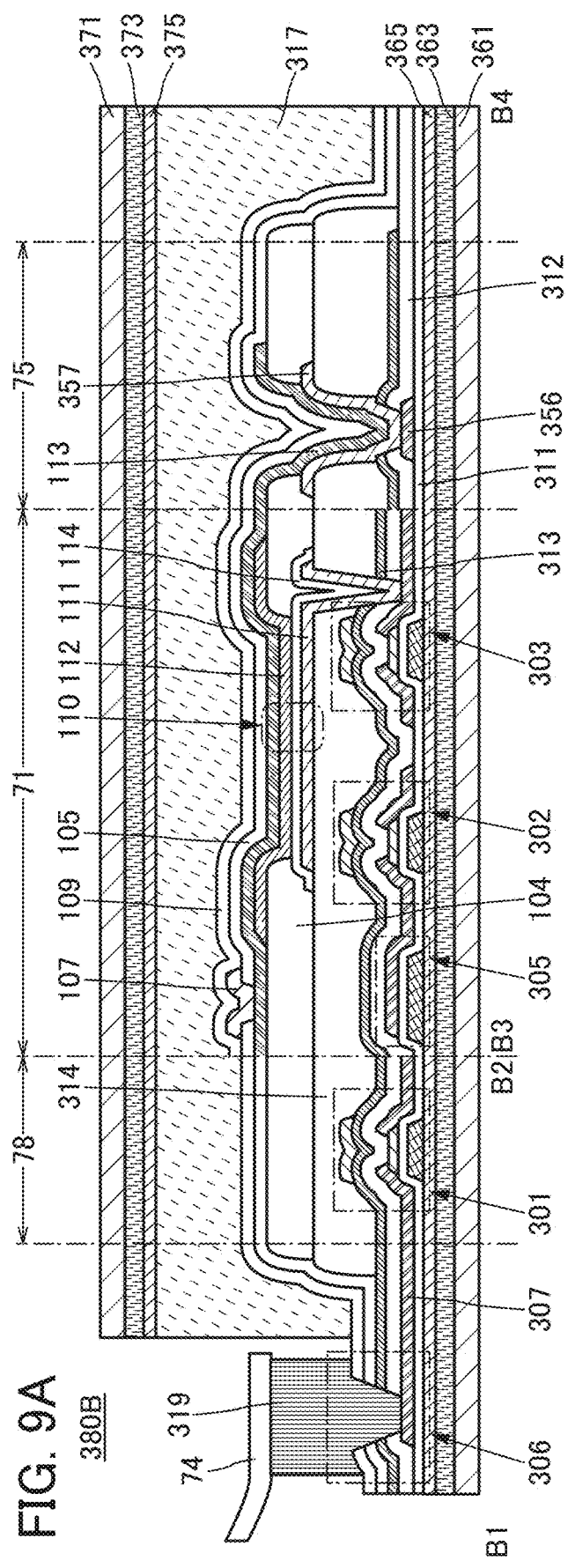
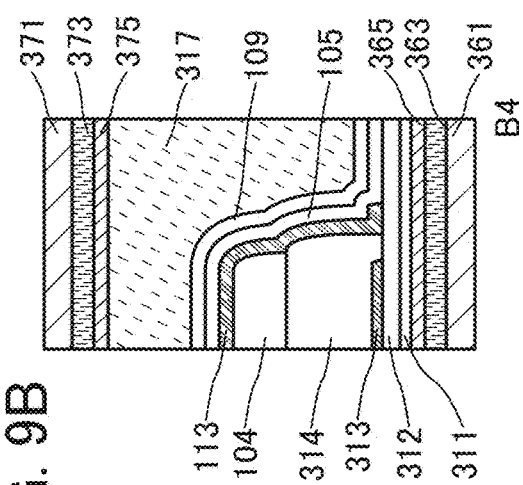

DISPLAY PANEL, DISPLAY DEVICE, DISPLAY MODULE, AND ELECTRONIC DEVICE HAVING AUXILIARY WIRING CONNECTED TO COMMON ELECTRODE

TECHNICAL FIELD

One embodiment of the present invention relates to a display panel, a display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

BACKGROUND ART

In recent years, display panels with high resolution have been demanded. For example, display panels including a large number of pixels, such as full high definition (1920× 1080 pixels), 4 K (e.g., 3840×2160 pixels or 4096×2160 pixels), and 8 K (e.g., 7680×4320 pixels or 8192×4320 pixels) display panels, have been actively developed.

Furthermore, larger display panels have been required. For example, the screen size of the mainstream home-use televisions has been 50 inches or more diagonally. A larger screen size allows a larger amount of information to be displayed at a time, and a further increase in screen size of digital signage and the like has been demanded.

Light-emitting elements utilizing electroluminescence (also referred to as EL elements) have features such as ease of thinning and lightening, high-speed response to an input signal, and driving with a direct-current low voltage source; thus, application of the EL elements to display panels has been proposed. For example, Patent Document 1 discloses a flexible light-emitting device including an organic EL element.

REFERENCE

Patent Document

[Patent Document 1] Japanese Published Patent Application No. 2014-197522

The aperture ratio of a top-emission display panel can be higher than that of a bottom-emission display panel because a transistor, a capacitor, a wiring, and the like can be provided so as to overlap with a light-emitting region of a light-emitting element in the top-emission display panel. Meanwhile, a common electrode of the top-emission display panel needs to transmit visible light because light from the light-emitting element is extracted through the common electrode. A visible-light-transmitting conductive material causes a problem of high resistance of the common electrode. When a drop in voltage due to the resistance of the common electrode occurs, potential distribution in a display surface becomes nonuniform, variation in luminance of light-emitting elements is caused, and display quality is degraded.

An object of one embodiment of the present invention is to suppress display unevenness or luminance unevenness of a display panel or a display device. Another object of one embodiment of the present invention is to provide a display panel or a display device with high display quality. Another object of one embodiment of the present invention is to provide a highly reliable display panel or display device.

Another object of one embodiment of the present invention is to increase the size of a display device. Another object of one embodiment of the present invention is to provide a display device including a wide display region in which a seam is less likely to be recognized. Another object of one embodiment of the present invention is to reduce the thickness or weight of a display device. Another object of one embodiment of the present invention is to provide a display device that can display an image along a curved surface. Another object of one embodiment of the present invention is to provide a highly browsable display device. Another object of one embodiment of the present invention is to provide a novel display panel or display device.

Note that the descriptions of these objects do not disturb the existence of other objects. One embodiment of the present invention does not necessarily achieve all the objects. Other objects can be derived from the description of the specification, the drawings, and the claims.

DISCLOSURE OF INVENTION

A display panel of one embodiment of the present invention includes a light-emitting element, a first insulating layer, a protective layer, and a conductive layer. The light-emitting element includes a first electrode, a light-emitting layer, and a second electrode. The light-emitting element emits light to the protective layer side. The first insulating layer includes a first opening overlapping with the first electrode. The first insulating layer covers an end portion of the first electrode. The light-emitting layer overlaps with the first electrode through the first opening. The second electrode is positioned over the light-emitting layer. The protective layer is positioned over the second electrode. The protective layer includes a second opening overlapping with the first insulating layer. The conductive layer is connected to the second electrode through the second opening.

The second electrode preferably covers an end portion of the light-emitting layer.

The first insulating layer preferably includes an inorganic insulating layer.

The resistivity of the conductive layer is preferably lower than that of the second electrode.

The protective layer preferably includes an inorganic film. The protective layer may include an organic insulating film. The conductive layer can include one or both of an inorganic film (preferably, an inorganic insulating film) and an organic insulating film.

The display panel of one embodiment of the present invention preferably further includes a second insulating layer. The second insulating layer is positioned over the conductive layer. The second insulating layer preferably includes a portion in contact with the protective layer.

The first insulating layer preferably includes a portion in contact with the protective layer.

One embodiment of the present invention is a display module including the display panel having any one of the above structures and a circuit board.

One embodiment of the present invention is an electronic device including the display module having any one of the above structures and at least one of an antenna, a battery, a housing, a camera, a speaker, a microphone, and an operation button.

A display device of one embodiment of the present invention includes a first display panel and a second display panel. The first display panel includes a first display region. The second display panel includes a second display region and a visible-light-transmitting region. The second display region is adjacent to the visible-light-transmitting region. The first display region includes a portion overlapping with the visible-light-transmitting region. The first display region includes a first light-emitting element, a first insulating layer, a first protective layer, and a first conductive layer. The first light-emitting element includes a first electrode, a first light-emitting layer, and a second electrode. The first light-emitting element emits light to the first protective layer side. The first insulating layer includes a first opening overlapping with the first electrode. The first insulating layer covers an end portion of the first electrode. The first light-emitting layer overlaps with the first electrode through the first opening. The second electrode is positioned over the first light-emitting layer. The first protective layer is over and in contact with the second electrode. The first protective layer includes a second opening overlapping with the first insulating layer. The first conductive layer is connected to the second electrode through the second opening.

The second display region of the display device preferably includes a second light-emitting element, a second insulating layer, a second protective layer, and a second conductive layer. The second light-emitting element includes a third electrode, a second light-emitting layer, and a fourth electrode. The second light-emitting element emits light to the second protective layer side. The second insulating layer includes a third opening overlapping with the third electrode. The second insulating layer covers an end portion of the third electrode. The second light-emitting layer overlaps with the third electrode through the third opening. The fourth electrode is positioned over the second light-emitting layer. The second protective layer is over and in contact with the fourth electrode. The second protective layer includes a fourth opening overlapping with the second insulating layer. The second conductive layer is connected to the fourth electrode through the fourth opening.

One embodiment of the present invention can suppress display unevenness or luminance unevenness of a display panel or a display device. One embodiment of the present invention can provide a display panel or a display device with high display quality. One embodiment of the present invention can provide a highly reliable display panel or display device.

One embodiment of the present invention can increase the size of a display device. One embodiment of the present invention can provide a display device including a wide display region in which a seam is less likely to be recognized. One embodiment of the present invention can reduce the thickness or weight of a display device. One embodiment of the present invention can provide a display device that can display an image along a curved surface. One embodiment of the present invention can provide a highly browsable display device. One embodiment of the present invention can provide a novel display panel or display device.

Note that the descriptions of these effects do not disturb the existence of other effects. One embodiment of the present invention does not necessarily achieve all the effects. Other effects can be derived from the description of the specification, the drawings, and the claims.

BRIEF DESCRIPTION OF DRAWINGS

In the accompanying drawings:

FIGS. 3A and 3B are cross-sectional views illustrating examples of a display panel;

FIGS. 6A and 6B are cross-sectional views illustrating examples of a display panel;

FIGS. 7A1 and 7A2 and 7B to 7D are cross-sectional views illustrating structure examples of a transistor;

FIGS. 8A to 8C are cross-sectional views illustrating examples of a display panel:

FIGS. 9A and 9B are cross-sectional views illustrating examples of a display panel:

BEST MODE FOR CARRYING OUT THE INVENTION

Figure 1A:
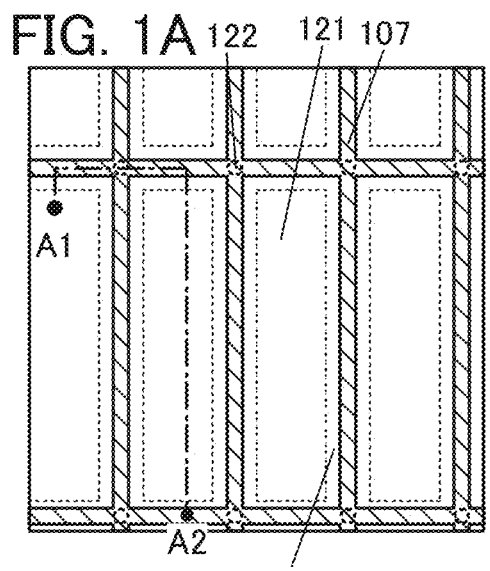
FIGS. 1A to 1E are top views and cross-sectional views illustrating examples of a display panel.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in the structures of the present invention described below, the same portions or portions having similar functions are denoted by the same reference numerals in common in different drawings and repetitive description thereof will be omitted. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, a display panel and a display device of one embodiment of the present invention will be described with reference to FIGS. 1A to 1E, FIGS. 2A and 2B. FIGS. 3A and 3B. FIGS. 4A to 4C, FIGS. 5A to 5C, FIGS. 6A and 6B, and FIGS. 7A1 and 7A2 and 7B to 7D.

Specific Example 1 of Display Panel

Figure 1B:
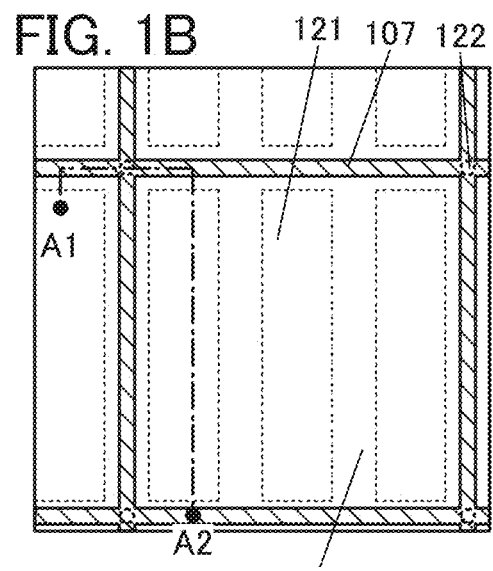
Figure 1C:
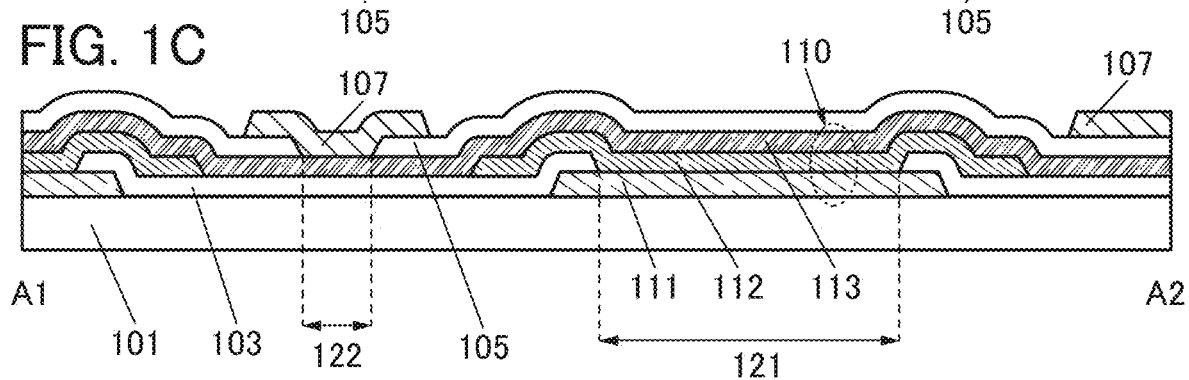
Figure 1D:
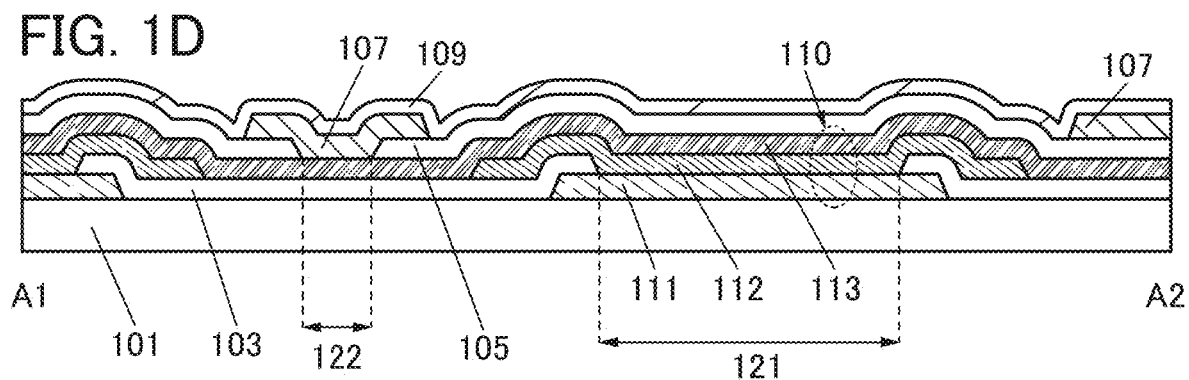
Figure 1E:
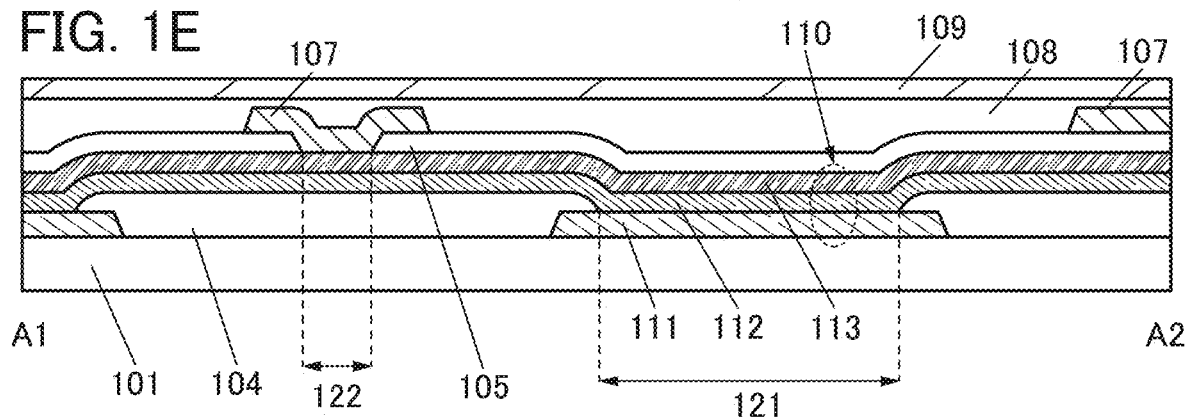

FIGS. 1A and 1B are each a top view of a pixel portion of the display panel. FIGS. 1C to 1E are each a cross-sectional view taken along dashed-dotted line A1-A2 in FIGS. 1A and 1B.

Regions 121 that are light-emitting regions of light-emitting elements are provided in the pixel portion of each of the display panels illustrated in FIGS. 1A and 1B. A protective layer 105 is provided in the pixel portion so as to cover the light-emitting element. When a film with a high barrier property is used for the protective layer 105, entry of impurities such as moisture and oxygen into the light-emitting element can be prevented. Thus, deterioration of the light-emitting element can be suppressed and the reliability of the display panel can be improved.

An auxiliary wiring 107 is provided over the protective layer 105. In a region 122, the auxiliary wiring 107 is connected to a common electrode of the light-emitting element. The region 122 corresponds to an opening in the protective layer 105. The common electrode is electrically connected to the auxiliary wiring 107, so that a drop in voltage due to the resistance of the common electrode can be inhibited. Accordingly, luminance unevenness of the display panel can be suppressed and the display quality of the display panel can be improved.

The auxiliary wiring 107 has an opening and the region 121 is provided inside the opening. In other words, the region 121 is surrounded by the auxiliary wiring 107. FIG. 1A illustrates an example in which the auxiliary wiring 107 surrounds one region 121 (one light-emitting element), and FIG. 1B illustrates an example in which the auxiliary wiring 107 surrounds three regions 121 (three light-emitting elements). As described above, a variety of layouts can be used for the auxiliary wiring 107 and the size, number, and the like of openings in the auxiliary wiring 107 are not particularly limited.

The pixel portion of the display panel illustrated in FIG. 1C includes a substrate 101, a light-emitting element 110, an insulating layer 103, the protective layer 105, and the auxiliary wiring 107.

The light-emitting element 110 includes a pixel electrode 111, an EL layer 112, and a common electrode 113. The pixel electrode 111 is provided over the substrate 101, the EL layer 112 is provided over the pixel electrode 111, and the common electrode 113 is provided over the EL layer 112. The light-emitting element 110 emits light to the protective layer 105 side.

When a voltage higher than the threshold voltage of the light-emitting element is applied between the pixel electrode 111 and the common electrode 113, holes are injected to the EL layer 112 from the anode side and electrons are injected to the EL layer 112 from the cathode side. The injected electrons and holes are recombined in the EL layer 112 and a light-emitting substance contained in the EL layer 112 emits light.

Since the display panel of one embodiment of the present invention has a top-emission structure, the pixel electrode 111 is an electrode through which light is not extracted. The pixel electrode 111 preferably includes a visible-light-reflecting conductive film.

For the visible-light-reflecting conductive film, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy containing silver and copper is preferable because of its high heat resistance. Furthermore, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, a visible-light-transmitting conductive film described later and a conductive film containing the metal material or the alloy may be stacked. For example, a stacked film of silver and indium tin oxide (ITO), a stacked film of an alloy of silver and magnesium and ITO, or the like can be used.

The EL layer 112 includes at least a light-emitting layer. The EL layer 112 may include a plurality of light-emitting layers. In addition to the light-emitting layer, the EL layer 112 may include a layer containing a substance with high hole-injection property, a substance with high hole-transport property, a hole-blocking material, a substance with high electron-transport property, a substance with high electron-injection property, a substance with a bipolar property (a substance with high electron-transport property and high hole-transport property), or the like. The EL layer 112 contains one or more kinds of light-emitting substances.

Either a low molecular compound or a high molecular compound can be used for the EL layer 112, and an inorganic compound may also be contained. The layers included in the EL layer 112 can be formed by any of the following methods: an evaporation method (including a vacuum evaporation method), a transfer method, a printing method, an inkjet method, a coating method, and the like.

The light-emitting element 110 may be a single element including one EL layer or a tandem element in which a plurality of EL layers are stacked with a charge generation layer therebetween.

In one embodiment of the present invention, a light-emitting element containing an inorganic compound such as a quantum dot may be employed.

The common electrode 113 is an electrode through which light is extracted. The common electrode 113 preferably includes a visible-light-transmitting conductive film.

The visible-light-transmitting conductive film can be formed using, for example, indium oxide, ITO, indium zinc oxide, zinc oxide (ZnO), gallium zinc oxide (Ga—Zn oxide), or aluminum zinc oxide (Al—Zn oxide). Alternatively, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin enough to have a light-transmitting property. Alternatively, a stacked film of any of the above materials can be used as the conductive film. For example, a stacked film of ITO and an alloy of silver and magnesium is preferably used, in which case conductivity can be increased. Still alternatively, graphene or the like may be used.

Each of the pixel electrode 111 and the common electrode 113 can be formed by an evaporation method or a sputtering method. Alternatively, a discharging method such as an inkjet method, a printing method such as a screen printing method, or a plating method can be used.

The insulating layer 103 is provided over the substrate 101. The insulating layer 103 has an opening overlapping with the pixel electrode 111. The region 121 illustrated in FIG. 1C is a portion where the insulating layer 103 is opened. The insulating layer 103 covers an end portion of the pixel electrode 111.

The EL layer 112 overlaps with the pixel electrode 111 in the region 121. Specifically, the pixel electrode 111 and the EL layer 112 are in contact with each other through the opening in the insulating layer 103. The common electrode 113 overlaps with the pixel electrode 111 and the EL layer 112 in the region 121. As described above, the region 121 is the light-emitting region of the light-emitting element.

The protective layer 105 is provided over the common electrode 113. The protective layer 105 has an opening overlapping with the insulating layer 103. The region 122 illustrated in FIG. 1C is a portion where the protective layer 105 is opened. The common electrode 113 and the auxiliary wiring 107 are in contact with each other through the opening in the protective layer 105. A bottom surface of the common electrode 113 may be provided below a top surface of the pixel electrode 111. Since light from the light-emitting element 110 is extracted to the outside of the display panel through the protective layer 105, the protective layer 105 preferably has high visible light transmittance.

The insulating layer 103 and the protective layer 105 each preferably include an inorganic film (or an inorganic insulating film). When the light-emitting element 110 is surrounded by the inorganic film, entry of impurities such as moisture and oxygen from the outside into the light-emitting element 110 can be prevented. The reaction between impurities and an organic compound or a metal material contained in the light-emitting element 110 might cause deterioration of the light-emitting element 110. Therefore, deterioration of the light-emitting element 110 is suppressed by making impurities less likely to enter the light-emitting element 110, whereby the reliability of the light-emitting element 110 can be improved.

In the case where the EL layers 112 of two light-emitting elements are separated from each other as illustrated in FIG. 1C, it is preferable that the common electrode 113 cover an end portion of the EL layer 112 and, more on the outside than the end portion of the EL layer 112, the common electrode 113 be in contact with the insulating layer 103 and the protective layer 105. A bottom surface of the common electrode 113 may be provided below a top surface of the pixel electrode 111. In particular, these three layers (i.e. the common electrode 113, the insulating layer 103, and the protective layer 105) are preferably inorganic films, in which case impurities can be less likely to enter the EL layer 112.

The inorganic film (or the inorganic insulating film) preferably has high moisture resistance through which water is less likely to be diffused and transmitted. The inorganic film (or the inorganic insulating film) through which one or both of hydrogen and oxygen as well as water are less likely to be diffused and transmitted is further preferable. Thus, the inorganic film (or the inorganic insulating film) can function as a barrier film. Diffusion of impurities from the outside into the light-emitting element 110 can be effectively prevented, which enables the fabrication of a highly reliable display panel.

The insulating layer 103 can be formed of one or more insulating films. The protective layer 105 preferably includes one or more insulating films. For each of the insulating layer 103 and the protective layer 105, an oxide insulating film, a nitride insulating film, an oxynitride insulating film, a nitride oxide insulating film or the like can be used. Examples of the oxide insulating film include a silicon oxide film, an aluminum oxide film a gallium oxide film, a germanium oxide film, an yttrium oxide film a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, oxynitride refers to a material that contains more oxygen than nitrogen, and nitride oxide refers to a material that contains more nitrogen than oxygen.

In particular, a silicon nitride film, a silicon nitride oxide film, and an aluminum oxide film are suitably used for the insulating layer 103 and the protective layer 105 because those films each have high moisture resistance.

An inorganic film containing ITO, Ga—Zn oxide, Al—Zn oxide. In—Ga—Zn oxide, or the like can be used for the protective layer 105. The inorganic film preferably has high resistance, specifically, higher resistance than the common electrode 113. The inorganic film may further contain nitrogen.

A visible-light-transmitting conductive film used for the common electrode 113 and a visible-light-transmitting inorganic film used for the protective layer 105 may contain the same metal element, for example. In this case, adhesion between the common electrode 113 and the protective layer 105 can be increased, whereby film separation and entry of impurities from an interface between the common electrode 113 and the protective layer 105 can be prevented.

A first ITO film and a second ITO film can be used for the common electrode 113 and the protective layer 105, respectively, for example. The second ITO film preferably has a higher resistivity than the first ITO film. Furthermore, a first Ga—Zn oxide film and a second Ga—Zn oxide film can be used for the common electrode 113 and the protective layer 105, respectively, for example. The second Ga—Zn oxide film preferably has a higher resistivity than the first Ga—Zn oxide film.

An inorganic film containing Ga, Zn, and O can be formed in an oxygen atmosphere or a mixed atmosphere of argon and oxygen with a Ga—Zn—O-based metal oxide target (a mixed sintered body of $Ga_2O_3$ and ZnO), for example. An insulating film containing Al, Zn, and O can be formed in the above-described atmosphere with an Al—Zn—O-based metal oxide target (a mixed sintered body of $Al_2O_3$ and ZnO), for example. An inorganic film containing Ga or Al and Zn, O, and N can be formed in a mixed atmosphere of argon, oxygen, and nitrogen with such targets.

The specific resistance of each of the insulating layer 103 and the protective layer 105 is preferably higher than or equal to $10^{10}$ Ωcm at 20° C.

The insulating layer 103 and the protective layer 105 can be formed by a chemical vapor deposition (CVD) method (such as a plasma-enhanced CVD (PECVD) method), a sputtering method (such as a DC sputtering method, an RF sputtering method, and an ion beam sputtering method), an atomic layer deposition (ALD) method, or the like.

A sputtering method and an ALD method are capable of forming a film at a low temperature. The EL layer 112 included in the light-emitting element 110 has low heat resistance. Therefore, the protective layer 105 formed after the fabrication of the light-emitting element 110 is preferably formed at a relatively low temperature, typically a temperature of lower than or equal to 100° C., and a sputtering method and an ALD method are suitable.

The insulating layer 103 formed before the fabrication of the light-emitting element 110 can be formed at high temperature. By making substrate temperature during deposition high (e.g., higher than or equal to 100° C. and lower than or equal to 350° C.), a dense film with a high barrier property can be formed. Not only a sputtering method and an ALD method but also a CVD method is suitable for forming the insulating layer 103. A CVD method has a high deposition rate; thus, it is preferable.

The insulating layer 103 or the protective layer 105 may have a stacked-layer structure including two or more insulating films formed by different deposition methods.

It is preferable that a first inorganic film be formed by a sputtering method, and then a second inorganic film be formed by an ALD method, for example.

A film formed by a sputtering method contains less impurities and has higher density than a film formed by an ALD method. The film formed by an ALD method has higher step coverage and is less likely to be influenced by the shape of a deposition surface than the film formed by a sputtering method.

The first inorganic film contains less impurities and has high density. The second inorganic film is formed so as to cover a portion which is not sufficiently covered with the first inorganic film by the influence of a step of a surface on which the first inorganic film is formed. In this case, a protective layer capable of further reducing diffusion of water or the like can be formed as compared with the case where only one of the inorganic films is formed.

Specifically, it is preferable that an aluminum oxide film, a zirconium oxide film, an ITO film, a Ga—Zn oxide film, an Al—Zn oxide film, or an In—Ga—Zn oxide film be formed by a sputtering method, and then an aluminum oxide film or a zirconium oxide film be formed by an ALD method.

The thickness of the inorganic film formed by a sputtering method is preferably greater than or equal to 50 nm and less than or equal to 1000 nm, further preferably greater than or equal to 100 nm and less than or equal to 300 nm.

The thickness of the inorganic film formed by an ALD method is preferably greater than or equal to 1 nm and less than or equal to 100 nm, further preferably greater than or equal to 5 nm and less than or equal to 50 nm.

The water vapor transmission rate of each of the insulating layer 103 and the protective layer 105 is lower than $1\times10^2$ g/(m²·day), preferably lower than or equal to $5\times10^3$ g/(m²·day), further preferably lower than or equal to $1\times10^{-4}$ g/(m²·day), still further preferably lower than or equal to $1\times10^{-5}$ g/(m²·day), yet further preferably lower than or equal to $1\times10$ g/(m²·day). The lower the water vapor transmission rate is, the more diffusion of water from the outside into the transistor and the light-emitting element can be reduced.

The thickness of each of the insulating layer 103 and the protective layer 105 is preferably greater than or equal to 1 nm and less than or equal to 1000 nm, further preferably greater than or equal to 50 nm and less than or equal to 500 nm, still further preferably greater than or equal to 100 nm and less than or equal to 300 nm. The thickness of the insulating layer is preferably small because the thinner the insulating layer is, the thinner the whole display panel can be. The thinner the insulating layer is, the more throughput is improved, so that the productivity of the display panel can be increased.

The auxiliary wiring 107 has a lower resistivity than the common electrode 113. For example, the auxiliary wiring 107 can be formed to have a single-layer structure or a stacked-layer structure using any of metal materials such as molybdenum, titanium, chromium, tantalum, tungsten, aluminum, copper, silver, neodymium, and scandium, and an alloy material containing any of these elements. A material used for the auxiliary wiring 107 preferably has a lower resistivity than a material used for the common electrode 113.

As illustrated in FIG. 1D, the display panel may include an inorganic insulating layer 109 that covers the protective layer 105 and the auxiliary wiring 107. Alternatively, as illustrated in FIG. 1E, the display panel may include an organic insulating layer 108 and the inorganic insulating layer 109 that cover the protective layer 105 and the auxiliary wiring 107. Note that the stacking order and the number of organic insulating layers and inorganic insulating layers formed over the auxiliary wiring 107 are not particularly limited. The insulating layer formed over the auxiliary wiring 107 can have a single-layer structure or a stacked-layer structure including one or both of an inorganic insulating film and an organic insulating film.

An inorganic insulating film that can be used for the insulating layer 103 and the protective layer 105 can be used for the inorganic insulating layer 109.

Examples of an organic insulating material that can be used for the organic insulating layer 108 include an acrylic resin, an epoxy resin, a polyimide resin, a polyamide resin, a polyimide-amide resin, a polysiloxane resin, a benzocyclobutene-based resin, and a phenol resin.

As illustrated in FIG. 1E, the insulating layer 103 may be replaced with an insulating layer 104 having a planarizing function. The insulating layer 104 is preferably formed using, for example, an organic insulating material that can be used for the organic insulating layer 108.

When an inorganic insulating film is used as an insulating layer covering the end portion of the pixel electrode 111, impurities are less likely to enter the light-emitting element 110 as compared with the case where an organic insulating film is used; therefore, the reliability of the light-emitting element 110 can be improved. When an organic insulating film is used as the insulating layer covering the end portion of the pixel electrode 111, a short circuit in the light-emitting element 110 can be prevented because the organic insulating film has higher step coverage and is less likely to be influenced by the shape of the pixel electrode 111 than an inorganic insulating film.

Note that the insulating layer 103 (or the insulating layer 104) and the protective layer 105 each can have a single-layer structure or a stacked-layer structure including one or both of an inorganic insulating film and an organic insulating film.

Specific Example 2 of Display Panel

Figure 2A:
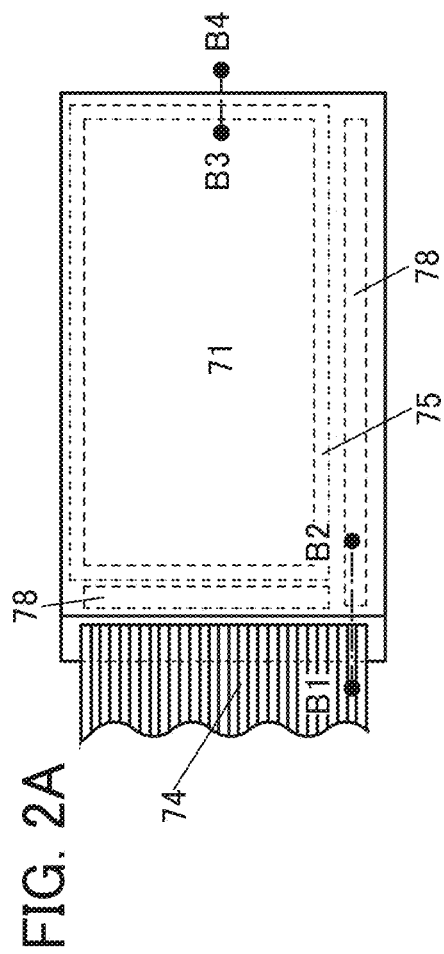
FIGS. 2A and 2B are a top view and a cross-sectional view illustrating an example of a display panel.
Figure 2B:
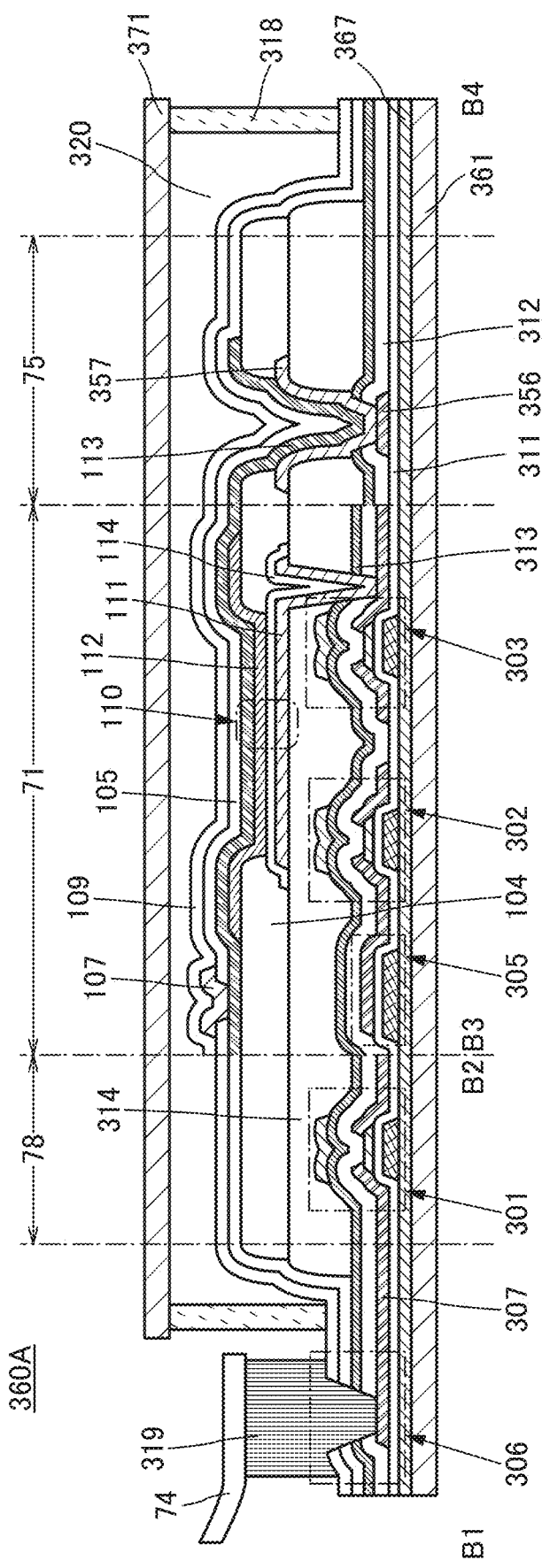

FIG. 2A is a top view of a display panel. FIG. 2B is a cross-sectional view of a display panel 360A. FIG. 2B corresponds to a cross-sectional view taken along dashed-dotted lines B1-B2 and B3-B4 in FIG. 2A.

The display panel illustrated in FIG. 2A includes a pixel portion 71, a connection portion 75, and a driver circuit 78. An FPC 74 is connected to the display panel.

The display panel 360A is a top-emission display panel employing a separate coloring method.

As illustrated in FIG. 2B, the display panel 360A includes a substrate 361, an insulating layer 367, transistors 301, 302, and 303, a capacitor 305, conductive layers 356 and 357, an insulating layer 314, the light-emitting element 110, the insulating layer 104, the protective layer 105, the auxiliary wiring 107, the inorganic insulating layer 109, a substrate 371, and the like.

The light-emitting element 110 includes the pixel electrode 111, the EL layer 112, and the common electrode 113. The pixel electrode 111 is electrically connected to a source or a drain of the transistor 303. They are directly connected to each other or connected via another conductive layer. The EL layer 112 is provided for each light-emitting element 110 and the end portion of the EL layer 112 is covered with the common electrode 113. The common electrode 113 covers the end portion of the EL layer 112 and is in contact with the insulating layer 104 more on the outside than the end portion of the EL layer 112.

The light-emitting element 110 further includes an optical adjustment layer 114. With the light-emitting element 110 having a microcavity structure, light with high color purity can be extracted from the display panel.

The insulating layer 104 covers the end portion of the pixel electrode 111 and an end portion of the optical adjustment layer 114. Two adjacent pixel electrodes 111 are electrically insulated from each other by the insulating layer 104.

The protective layer 105 covers an end portion of the common electrode 113 in the connection portion 75 and is in contact with the insulating layer 104 and the inorganic insulating layer 109 more on the outside than the end portion of the common electrode 113. With such a structure, entry of impurities into the common electrode 113 can be prevented.

The protective layer 105 and the inorganic insulating layer 109 cover an end portion of the insulating layer 314 and an end portion of the insulating layer 104 at and in the vicinity of an end portion of the display panel 360A, and the protective layer 105 is in contact with an insulating layer 313 more on the outside than the end portion of the insulating layer 314 and the end portion of the insulating layer 104. In the display panel of this embodiment, the variety of insulating layers and the protective layer 105 are preferably provided so that an end portion of an inorganic film (or an inorganic insulating film) is positioned more on the outside than an end portion of an organic film and inorganic films (or inorganic insulating films) are stacked in contact with each other at and in the vicinity of the end portion of the display panel. With such a structure, impurities such as moisture are less likely to enter the display panel from the outside of the display panel, whereby deterioration of the transistor and the light-emitting element 110 can be suppressed.

The auxiliary wiring 107 is electrically connected to the common electrode 113 through the opening in the protective layer 105. The opening in the protective layer 105 is provided over the insulating layer 104. The auxiliary wiring 107 is covered with the inorganic insulating layer 109.

Description in Specific example 1 of display panel can be referred to for the light-emitting element 110, the insulating layer 104, the protective layer 105, the auxiliary wiring 107, and the inorganic insulating layer 109.

The substrate 361 and the substrate 371 are bonded to each other with a bonding layer 318. A space 320 formed by the substrates 361 and 371 and the bonding layer 318 is preferably filled with a resin or an inert gas such as nitrogen or argon.

For the substrates 361 and 371, a material such as glass, quartz, a resin, a metal, an alloy, or a semiconductor can be used. For the substrate through which light from the light-emitting element is extracted, a material that transmits the light is used. A flexible substrate is preferably used as each of the substrates 361 and 371.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

The driver circuit 78 includes the transistor 301. The pixel portion 71 includes the transistor 302 and the transistor 303.

Each transistor includes a gate, a gate insulating layer 311, a semiconductor layer, a back gate, a source, and a drain. The gate (the lower gate) and the semiconductor layer overlap with each other with the gate insulating layer 311 positioned therebetween. Part of the gate insulating layer 311 functions as a dielectric of the capacitor 305. The conductive layer functioning as a source or a drain of the transistor 302 also functions as one electrode of the capacitor 305. The back gate (the upper gate) and the semiconductor layer overlap with each other with an insulating layer 312 and the insulating layer 313 positioned therebetween. It is preferable that the two gates be electrically connected to each other.

The structure of the transistor may be different between the driver circuit 78 and the pixel portion 71. The driver circuit 78 and the pixel portion 71 may each include a plurality of kinds of transistors.

The capacitor 305 includes a pair of electrodes and the dielectric therebetween. The capacitor 305 includes a conductive layer that is formed using the same material and the same step as the gate (the lower gate) of the transistor and a conductive layer that is formed using the same material and the same step as the source and the drain of the transistor.

The transistor, the capacitor, the wiring, and the like are provided to overlap with a light-emitting region of the light-emitting element 110, whereby the aperture ratio of the pixel portion 71 can be increased.

A material through which impurities such as water and hydrogen are less likely to be diffused is preferably used for at least one of the insulating layers 312, 313, and 314. Diffusion of impurities from the outside into the transistor can be effectively prevented, leading to improved reliability of the display panel. The insulating layer 314 functions as a planarization layer.

The insulating layer 367 functions as a base film. A material through which impurities such as water and hydrogen are less likely to be diffused is preferably used for the insulating layer 367.

A connection portion 306 includes a conductive layer 307. The conductive layer 307 can be formed using the same material and the same step as those of the source and the drain of the transistor. The conductive layer 307 is electrically connected to an external input terminal through which a signal or a potential from the outside is transmitted to the driver circuit 78. Here, an example in which the FPC 74 is provided as an external input terminal is shown. The FPC 74 and the conductive layer 307 are electrically connected to each other through a connector 319.

As the connector 319, any of various anisotropic conductive films (ACF), anisotropic conductive pastes (ACP), and the like can be used.

The connection portion 75 in which the common electrode 113 is electrically connected to the conductive layers 356 and 357 is provided outside the pixel portion 71. The conductive layer 356 can be formed using the same material and the same step as those of the source and the drain of the transistor. The conductive layer 357 can be formed using the same material and the same step as those of the pixel electrode 111. The above-described structure in which the conductive layer formed using the same material and the same step as those of the conductive layer of the transistor or the light-emitting element is electrically connected to the common electrode 113 can inhibit a drop in voltage due to the resistance of the common electrode 113 and suppress display unevenness of the display panel.

Since the display panel of this embodiment includes both of the auxiliary wiring 107 and the connection portion 75, a drop in voltage due to the resistance of the common electrode 113 can be inhibited and display unevenness of the display panel can be suppressed. The connection portion 75 is preferably provided so as to surround four sides of the pixel portion 71.

Specific Example 3 of Display Panel

FIG. 3A is a cross-sectional view of a display panel 360B. FIG. 3A corresponds to a cross-sectional view taken along dashed-dotted lines B1-B2 and B3-B4 in FIG. 2A.

The display panel 360B illustrated in FIG. 3A is different from the display panel 360A in that a coloring layer 131 and a light-blocking layer 132 are provided on the substrate 371 side and the EL layer 112 is shared by a plurality of pixels. Description of portions in common with the display panel 360A is omitted.

Although the display panel 360A employing a separate coloring method is described as an example, the display panel can also employ a color filter method as the display panel 360B.

The coloring layer 131 is a colored layer that transmits light in a specific wavelength range. For example, a color filter for transmitting light in a red, green, blue, or yellow wavelength range can be used. Examples of a material that can be used for the coloring layer 131 include a metal material, a resin material, and a resin material containing pigment or dye.

The light-blocking layer 132 is provided between adjacent coloring layers 131. The light-blocking layer 132 blocks light from an adjacent light-emitting element 110 to prevent color mixture between adjacent light-emitting elements 110. Here, the coloring layer 131 is provided such that its end portion overlaps with the light-blocking layer 132, whereby light leakage can be suppressed. For the light-blocking layer 132, a material that blocks light from the light-emitting element 110 can be used, for example, a black matrix can be formed using a metal material or a resin material containing pigment or dye. Note that it is preferable to provide the light-blocking layer 132 in a region other than the pixel portion 71, such as the driver circuit 78, in which case undesired leakage of guided light or the like can be inhibited.

The common electrode 113 is electrically connected to the conductive layers 356 and 357 more on the outside than the end portion of the EL layer 112 (see the connection portion 75 in FIG. 3A).

As described above, a drop in voltage due to the resistance of the common electrode 113 can be inhibited and display unevenness of the display panel can be suppressed also in the display panel employing a color filter method by providing both of the auxiliary wiring 107 and the connection portion 75.

The protective layer 105 and the inorganic insulating layer 109 illustrated in FIG. 3A cover the end portion of the insulating layer 314 and the end portion of the insulating layer 104 at and in the vicinity of an end portion of the display panel 360B, and the protective layer 105 is in contact with the insulating layer 313 more on the outside than the end portion of the insulating layer 314 and the end portion of the insulating layer 104. Since the display panel includes a portion where an organic insulating film is not provided and inorganic films (or inorganic insulating films) are in contact with each other at and in the vicinity of the end portion of the display panel, impurities such as moisture are less likely to enter the display panel from the outside of the display panel, whereby deterioration of the transistor and the light-emitting element 110 can be suppressed.

FIG. 3B illustrates a modification example of the end portion of the display panel and the vicinity thereof. In FIG. 3B, an opening 308 reaching the insulating layer 313 is provided in the insulating layer 314, and the insulating layer 313 and the protective layer 105 are in contact with each other in the opening 308. As described above, when an organic insulating film has an opening and inorganic films (or inorganic insulating films) are in contact with each other in the opening, impurities such as moisture are less likely to enter the display panel from the outside of the display panel, whereby deterioration of the transistor and the light-emitting element 110 can be suppressed even in the case where the organic insulating film extends to the end portion of the display panel.

In FIG. 3B, the conductive layer 307 is electrically connected to the FPC 74 through a conductive layer 355 and the connector 319.

Specific Example of Display Device

Next, a display device including a plurality of display panels will be described with reference to FIGS. 4A to 4C.

Figure 4A:
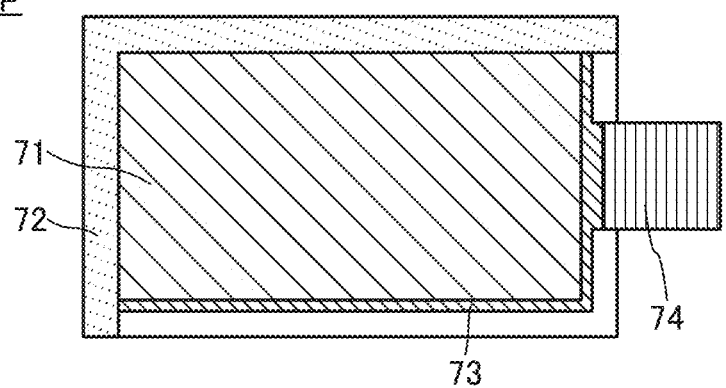
FIGS. 4A to 4C are a top view illustrating an example of a display panel and perspective views illustrating an arrangement example of display panels.
Figure 4B:
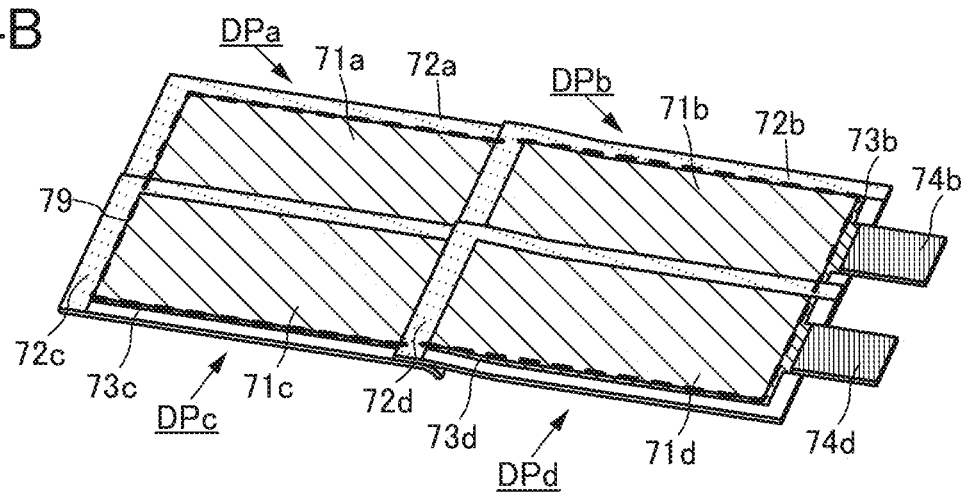
Figure 4C:
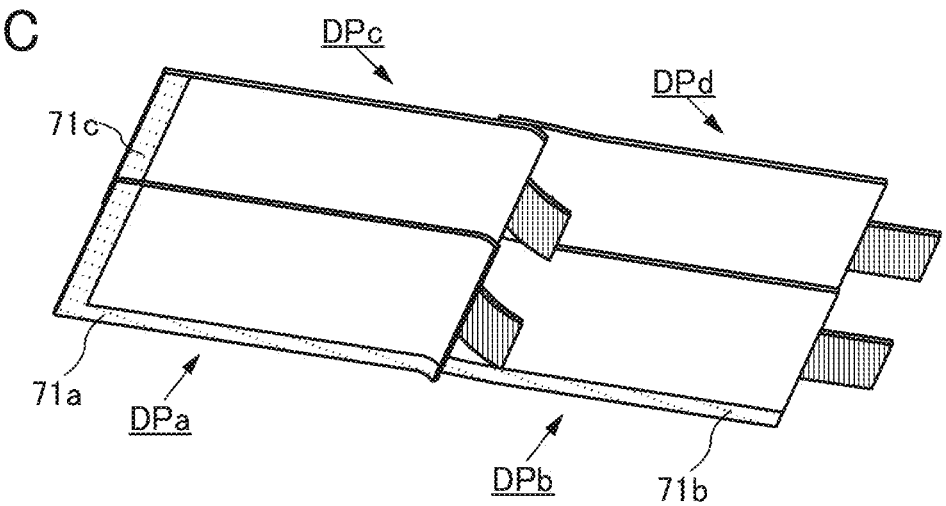

FIG. 4A is a top view of a display panel DP and FIGS. 4B and 4C are perspective views of a display device including four display panels DP.

When the plurality of display panels DP are arranged in one or more directions (e.g., in one column or in matrix), a display device with a large display region can be manufactured.

In the case where a large display device is manufactured using the plurality of display panels DP each of the display panels DP is not required to be large. Thus, an apparatus for manufacturing the display panel DP does not need to be increased in size, whereby space-saving can be achieved. In addition, since an apparatus for manufacturing small- and medium-size display panels can be used, there is no need to use a novel manufacturing apparatus for increasing the size of the display device, which leads to a reduction in manufacturing cost. In addition, a decrease in yield caused by an increase in the size of the display panel DP can be suppressed.

A display portion including the plurality of display panels DP has a larger display region than a display portion including one display panel DP when the display panels DP have the same size, and has an effect of displaying more information at a time, for example.

Here, the case where the display panel DP has a non-display region that surrounds the pixel portion 71 is considered. At this time, for example, if output images of the plurality of display panels DP are used to display one image, the image appears divided to a user of the display device.

Making the non-display regions of the display panels DP small (using the display panels DP with narrow frames) can prevent an image displayed on the display panels DP from appearing divided; however, it is difficult to totally remove the non-display regions of the display panels DP.

A small non-display region of the display panel DP leads to a decrease in the distance between an edge of the display panel DP and an element in the display panel DP, in which case the element easily deteriorates by impurities entering from the outside of the display panel DP in some cases.

Thus, in one embodiment of the present invention, the plurality of display panels DP are arranged to partly overlap with one another. In two display panels DP overlapping with each other, at least the display panel DP on the display surface side (upper side) includes a visible-light-transmitting region 72 that is adjacent to the pixel portion 71. In one embodiment of the present invention, the pixel portion 71 of the display panel DP on the lower side and the visible-light-transmitting region 72 of the display panel DP on the upper side overlap with each other. Therefore, a non-display region between the pixel portions 71 of the overlapping two display panels DP can be reduced or even removed. As a result, the large-sized display device in which a joint portion of the display panels DP is hardly seen by the user can be obtained.

At least part of a non-display region of the display panel DP on the upper side is the visible-light-transmitting region 72, and can overlap with the pixel portion 71 of the display panel DP on the lower side. Furthermore, at least part of a non-display region of the display panel DP on the lower side can overlap with the pixel portion 71 of the display panel DP on the upper side or a visible-light-blocking region 73 thereof. It is not necessary to reduce the areas of the non-display regions because a reduction in the area of the frame of the display device (a reduction in area except a pixel portion) is not affected by these regions.

A large non-display region of the display panel DP leads to an increase in the distance between the edge of the display panel DP and an element in the display panel DP, in which case the deterioration of the element due to impurities entering from the outside of the display panel DP can be suppressed. For example, in the case where an organic EL element is used as a display element, impurities such as moisture and oxygen are less likely to enter (or less likely to reach) the organic EL element from the outside of the display panel DP as the distance between the end portion of the display panel DP and the organic EL element increases. Since a sufficient area of the non-display region of the display panel DP is secured in the display device of one embodiment of the present invention, the highly reliable large display device can be fabricated even when the display panel DP including an organic EL element or the like is used.

As described above, when the plurality of display panels DP are provided in the display device, the plurality of display panels DP are preferably arranged so that the pixel portions 71 are arranged continuously between the adjacent display panels DP.

The display panel DP illustrated in FIG. 4A includes the pixel portion 71, the visible-light-transmitting region 72, and the visible-light-blocking region 73. The visible-light-transmitting region 72 and the visible-light-blocking region 73 are each provided adjacent to the pixel portion 71. The display panel DP is provided with the FPC 74 in the example illustrated in FIG. 4A.

The pixel portion 71 includes a plurality of pixels. In the visible-light-transmitting region 72, a pair of substrates included in the display panel DP, a sealant for sealing the display element sandwiched between the pair of substrates, and the like may be provided. Here, for members provided in the visible-light-transmitting region 72, visible-light-transmitting materials are used. In the visible-light-blocking region 73, for example, a wiring electrically connected to the pixel in the pixel portion 71 may be provided. Moreover, one or both of a scan line driver circuit and a signal line driver circuit may be provided for the visible-light-blocking region 73. Furthermore, a terminal connected to the FPC 74, a wiring connected to the terminal, and the like may be provided for the visible-light-blocking region 73.

FIGS. 4B and 4C illustrate an example in which the display panels DP illustrated in FIG. 4A are arranged in a 2×2 matrix (two display panels DP are arranged in each the longitudinal direction and the lateral direction). FIG. 4B is a perspective view of the display panel DP on the display surface side, and FIG. 4C is a perspective view of the display panel DP on the side opposite to the display surface side.

Four display panels DP (display panels DPa, DPb, DPc, and DPd) are arranged so as to have regions overlapping with each other. Specifically, the display panels DPa, DPb, DPc, and DPd are arranged so that the visible-light-transmitting region 72 of one display panel DP has a region overlapping with the top surface (the display surface side) of the pixel portion 71 of another display panel DP. In addition, the display panels DPa. DPb, DPc, and DPd are arranged so that the visible-light-blocking region 73 of one display panel DP does not overlap with the top surface of the pixel portion 71 of another display panel DP. In a portion where the four display panels DP overlap with each other, the display panels DPb, DPc, and DPd overlap with the top surface of the display panel DPa, the top surface of the display panel DPb, and the top surface of the display panel DPc, respectively.

The short side of the display panel DPa and the short side of the display panel DPb overlap with each other, and part of a pixel portion 71a and part of a visible-light-transmitting region 72b overlap with each other. Furthermore, the long side of the display panel DPa and the long side of the display panel DPc overlap with each other, and part of the pixel portion 71a and part of a visible-light-transmitting region 72c overlap with each other.

Part of a pixel portion 71b overlap with part of the visible-light-transmitting region 72c and part of a visible-light-transmitting region 72d. In addition, part of a pixel portion 71c overlaps with part of the visible-light-transmitting region 72d.

Therefore, a region where the pixel portions 71a to 71d are placed almost seamlessly can be a display region 79 of the display device.

Here, it is preferable that the display panel DP have flexibility. For example, the pair of substrates included in the display panel DP preferably has flexibility.

Thus, as illustrated in FIGS. 4B and 4C, a region near an FPC 74*a* of the display panel DPa can be bent so that part of the display panel DPa and part of the FPC 74*a* can be placed under the pixel portion 71*b* of the display panel DPb adjacent to the FPC 74*a*, for example. As a result, the FPC 74*a* can be placed without physical interference with the rear surface of the display panel DPb. Furthermore, when the display panel DPa and the display panel DPb overlap with each other and are fixed, it is not necessary to consider the thickness of the FPC 74*a*; thus, the top surface of the visible-light-transmitting region 72*b* and the top surface of the display panel DPa can be substantially leveled. This can make an end portion of the display panel DPb over the pixel portion 71*a* less noticeable.

Moreover, each display panel DP has flexibility, whereby the display panel DPb can be curved gently so that the top surface of the pixel portion 71*b* of the display panel DPb and the top surface of the pixel portion 71*a* of the display panel DPa are equal to each other in height. Thus, the heights of the display regions can be equal to each other except in the vicinity of the region where the display panel DPa and the display panel DPb overlap with each other, so that the display quality of a picture displayed on the display region 79 can be improved.

Although the relation between the display panel DPa and the display panel DPb is taken as an example in the above description, the same can apply to the relation between any other two adjacent display panels DP.

To reduce the step between two adjacent display panels DP, the thickness of the display panel DP is preferably small. For example, the thickness of the display panel DP is preferably less than or equal to 1 mm, further preferably less than or equal to 300 µm, still further preferably less than or equal to 100 µm.

The display panel DP preferably includes both of a scan line driver circuit and a signal line driver circuit. In the case where a driver circuit is provided separately from the display panel, a printed circuit board including a driver circuit, a large number of wirings, a large number of terminals, and the like are provided on the back side (the side opposite to the display surface side) of the display panel. Thus, the number of parts of the whole display device becomes enormous, which leads to increase in weight of the display device in some cases. When the display panel DP includes both of a scan line driver circuit and a signal line driver circuit, the number of parts of the display device can be reduced and the display device can be lightweight. Accordingly, the display device can be highly portable.

Here, the scan line driver circuit and the signal line driver circuit are required to operate at a high driving frequency in accordance with the frame frequency of an image to be displayed. In particular, the signal line driver circuit is required to operate at a higher driving frequency than the scan line driver circuit. Therefore, some transistors used for the signal line driver circuit require large current supply capability in some cases. Meanwhile, some transistors provided in the pixel portion require adequate withstand voltage for driving a display element in some cases.

In view of the above, the transistor of the driver circuit and the transistor of the pixel portion are preferably formed to have different structures. For example, one or more of the transistors provided in the pixel portion are high withstand voltage transistors, and one or more of the transistors provided in the driver circuit are transistors with high driving frequency.

Specifically, one or more of the transistors used for the signal line driver circuit include a thinner gate insulating layer than that of the transistor used for the pixel portion. By forming two kinds of transistors separately as described above, the signal line driver circuit can be formed over the substrate over which the pixel portion is provided.

One or more of the transistors used for the signal line driver circuit preferably have a shorter channel length than that of the transistor used for the pixel portion. For example, the channel length of the transistor of the signal line driver circuit is shorter than 1.5 µm, preferably shorter than or equal to 1.2 µm, further preferably shorter than or equal to 1.0 µm, still further preferably shorter than or equal to 0.9 µm, yet further preferably shorter than or equal to 0.8 µm, yet still further preferably shorter than or equal to 0.6 µm, and preferably longer than or equal to 0.1 µm.

The transistor provided in the pixel portion preferably has a longer channel length than the shortest channel length among the channel lengths of the transistors of the signal line driver circuit. For example, the channel length of the transistor provided in the pixel portion is longer than or equal to 1 µm, preferably longer than or equal to 1.2 µm, further preferably longer than or equal to 1.4 µm, and shorter than or equal to 20 µm, preferably shorter than or equal to 15 µm, further preferably shorter than or equal to 10 µm.

A metal oxide is preferably used for a semiconductor, in which a channel is formed, of the transistor used for each of the scan line driver circuit, the signal line driver circuit, and the pixel portion. Thus, a signal line driver circuit that is hardly achieved in a display panel using amorphous silicon can be mounted on a display panel, for example. In addition, a display panel including a metal oxide can be manufactured with a high yield at low cost because the display panel has small variation in characteristics and the area of the display panel can be easily increased as compared with a display panel including polycrystalline silicon or the like.

A transistor 210*a* and a transistor 210*b*, which are described later, are preferably used for the pixel portion and the driver circuit, respectively, for example (see FIGS. 7A1 and 7A2).

Note that in this specification and the like, the channel length direction of a transistor refers to one of directions parallel to the shortest line connecting a source and a drain. In other words, the channel length direction corresponds to a current flow direction in a semiconductor layer when a transistor is in an on state. The channel width direction refers to a direction orthogonal to the channel length direction. Each of the channel length direction and the channel width direction is not fixed to one direction in some cases depending on the structure and the shape of a transistor.

In this specification and the like, the channel length of a transistor refers to, for example, the length in the channel length direction of a region where a semiconductor layer and a gate electrode overlap with each other in a top view or a cross-sectional view of the transistor. The channel width of a transistor refers to the length in the channel width direction of the region.

Each of the channel length and the channel width is not fixed to one value in some cases depending on the structure and the shape of a transistor. Thus, in this specification and the like, each of the channel length and the channel width can be the maximum value, the minimum value, the average value, or a given value between the maximum value and the minimum value. Typically, the minimum channel length and the minimum channel width are used.

A transistor may include a pair of gate electrodes (a first gate electrode and a second gate electrode) with a semiconductor layer positioned therebetween depending on the structure of the transistor. Here, each of the channel length and the channel width of the transistor can be defined by two values corresponding to the gate electrodes. Thus, in this specification and the like, in the case where the term "channel length" is simply used, it represents one or both of a longer channel length and a shorter channel length of the two channel lengths or the average of the two channel lengths. Similarly, in this specification and the like, in the case where the term "channel width" is simply used, it represents one or both of a longer channel width and a shorter channel width of the two channel widths or the average of the two channel widths.

Specific Example 4 of Display Panel

Figure 5B:
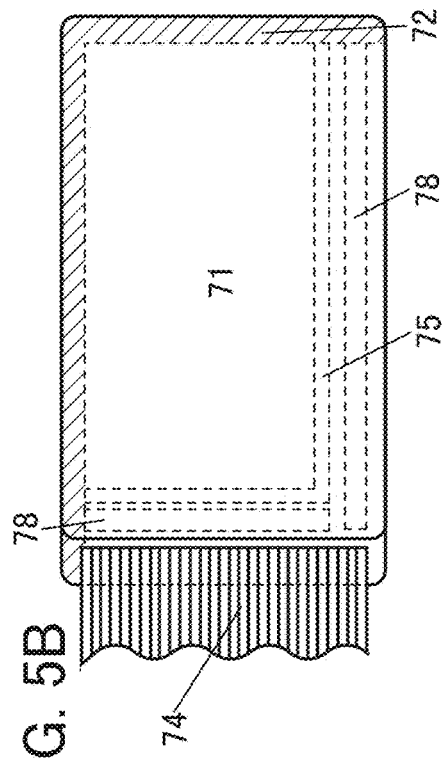
FIGS. 5A to 5C are top views and a cross-sectional view illustrating examples of a display panel.
Figure 5A:
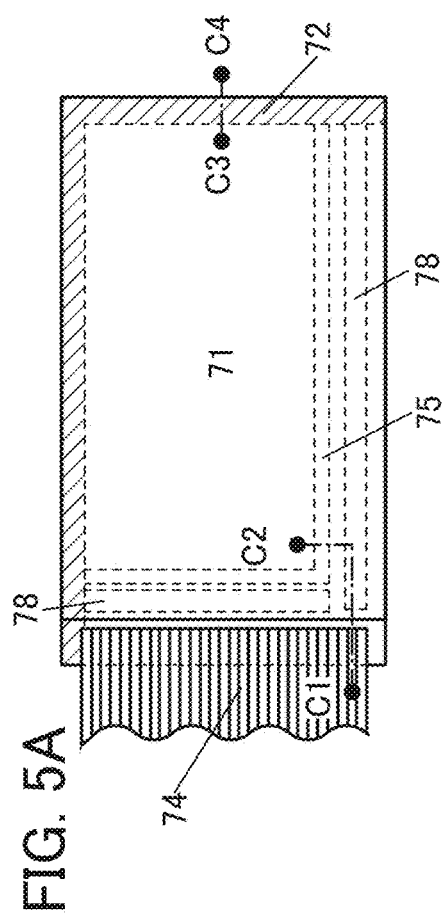
Figure 5C:
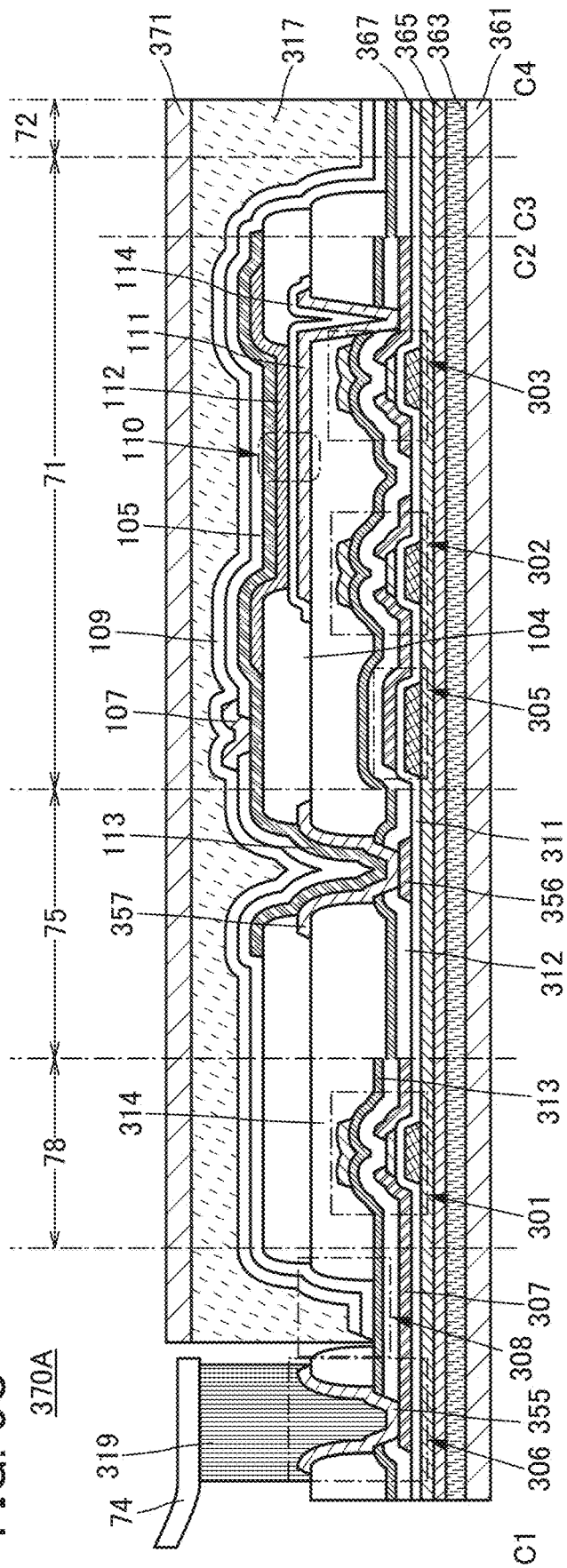

FIGS. 5A and 5B are top views of display panels. FIG. 5C and FIGS. 6A and 6B are cross-sectional views taken along dashed-dotted lines C1-C2 and C3-C4 in FIG. 5A.

The display panels illustrated in FIGS. 5A and 5B each include the pixel portion 71, the visible-light-transmitting region 72, the connection portion 75, and the driver circuit 78. The FPC 74 is connected to the display panel. FIGS. 5A and 5B each illustrate an example in which the visible-light-transmitting region 72 is adjacent to the pixel portion 71 and provided along two sides of the pixel portion 71. Furthermore, in the example illustrated in FIGS. 5A and 5B, the connection portion 75 is provided along the other two sides of the pixel portion 71.

The display panel illustrated in FIG. 5A has a sharp corner and the display panel illustrated in FIG. 5B has a rounded corner. A display panel using a film substrate can be fabricated to have various top surface shapes. For example, a display panel with a corner having a curvature is easily fabricated in some cases because the display panel is less likely to be cracked when the display panel is divided.

As illustrated in FIG. 5C, a display panel 370A includes the substrate 361, a bonding layer 363, insulating layers 365 and 367, the transistors 301, 302, and 303, the capacitor 305, the conductive layers 356 and 357, the insulating layer 314, the light-emitting element 110, the insulating layer 104, the protective layer 105, the auxiliary wiring 107, the inorganic insulating layer 109, the substrate 371, and the like.

The display panel 370A is a top-emission display panel employing a separate coloring method.

The substrate 361 and the substrate 371 are bonded to each other with a bonding layer 317. The substrate 361 and the insulating layer 365 are bonded to each other with the bonding layer 363.

In the fabrication of the display panel 370A, the transistor, the light-emitting element 110, and the like formed over a formation substrate are transferred to the substrate 361.

In the vicinity of the connection portion 306 of the display panel 370A, the opening 308 reaching the insulating layer 313 is provided in the insulating layer 314, and the insulating layer 313 and the protective layer 105 are in contact with each other in the opening 308. As described above, when an organic insulating film has an opening and inorganic films (or inorganic insulating films) are in contact with each other in the opening, impurities such as moisture are less likely to enter the display panel from the outside of the display panel, whereby deterioration of the transistor and the light-emitting element 110 can be suppressed even in the case where the organic insulating film extends to the end portion of the display panel. The protective layer 105 and the inorganic insulating layer 109 cover the end portion of the insulating layer 314 and the end portion of the insulating layer 104 in the vicinity of the visible-light-transmitting region 72 of the pixel portion 71 of the display panel 370A, and the protective layer 105 is in contact with the insulating layer 313 more on the outside than the end portion of the insulating layer 314 and the end portion of the insulating layer 104 (these portions can be regarded as parts of the visible-light-transmitting region 72). With such a structure, impurities such as moisture are less likely to enter the display panel from the outside of the display panel, whereby deterioration of the transistor and the light-emitting element 110 can be suppressed.

The above description of the display panel 360A illustrated in FIG. 2B can be referred to for the structures of the pixel portion 71, the connection portion 75, the driver circuit 78, and the connection portion 306 of the display panel 370A illustrated in FIG. 5C because the structures are in common with those in the display panel 360A illustrated in FIG. 2B in many points.

The layers included in the visible-light-transmitting region 72 transmit visible light. FIG. 5C illustrates an example in which the visible-light-transmitting region 72 includes the substrate 361, the bonding layer 363, the insulating layer 365, the insulating layer 367, the gate insulating layer 311, the insulating layer 312, the insulating layer 313, the protective layer 105, the inorganic insulating layer 109, the bonding layer 317, and the substrate 371. In this stacked-layer structure, the materials for the layers are preferably selected such that a difference in refractive index at each interface is minimized. A difference in refractive index between two layers that are in contact with each other is reduced, so that a junction between the two display panels cannot be easily recognized by a user.

As in each of a display panel 370B illustrated in FIG. 6A and a display panel 370C illustrated in FIG. 6B, the number of insulating layers included in the visible-light-transmitting region 72 is preferably smaller than that of insulating layers included in a portion, which is in the vicinity of the visible-light-transmitting region 72, of the pixel portion 71.

The display panel 370B is different from the display panel 370A in that the visible-light-transmitting region 72 does not include the insulating layer 313, the protective layer 105, and the inorganic insulating layer 109.

The display panel 370C is different from the display panel 370A in that the visible-light-transmitting region 72 does not include the insulating layer 367, the gate insulating layer 311, the insulating layer 312, the insulating layer 313, the protective layer 105, and the inorganic insulating layer 109.

The number of insulating layers included in the visible-light-transmitting region 72 is reduced, and thus the number of interfaces at which a difference in refractive index is large can be reduced. Thus, the reflection of external light in the visible-light-transmitting region 72 can be suppressed. In this case, the visible light transmittance in the visible-light-transmitting region 72 can be increased. Thus, the difference in the luminance (brightness) of display on the display panel on the lower side between a portion seen through the visible-light-transmitting region 72 and a portion seen not through the region can be small. Accordingly, the display unevenness or luminance unevenness of the display device can be suppressed.

The structures of the display panels 370A. 370B, and 370C are the same except for the structure of the portion, which is in the vicinity of the visible-light-transmitting region 72, of the pixel portion 71 and the structure of the visible-light-transmitting region 72.

Since the visible-light-transmitting region 72 is provided in contact with the pixel portion 71, the connection portion 75 is provided not adjacent to at least one side of the pixel portion 71. A drop in voltage due to the resistance of the common electrode 113 is easily caused on the side where the connection portion 75 is not provided. The display panel of this embodiment includes the auxiliary wiring 107, so that a drop in voltage can be inhibited in the whole pixel portion 71 and luminance unevenness of the display panel can be suppressed. Accordingly, the display quality of the display panel can be improved.

[Structure Example of Transistor]

Next, transistors that can be used for the display panel or the display device will be described.

The structure of the transistors in the display panel or the display device is not particularly limited. For example, a planar transistor, a staggered transistor, or an inverted staggered transistor may be used. A top-gate transistor or a bottom-gate transistor may be used. Gate electrodes may be provided above and below a channel.

FIGS. 7A1 and 7A2 and 7B to 7D illustrate structure examples of a transistor. Each transistor is provided between an insulating layer 141 and an insulating layer 208. The insulating layer 141 preferably functions as a base film. The insulating layer 208 preferably functions as a planarization film.

The transistors 210a and 210b illustrated in FIGS. 7A1 and 7A2 are each a top-gate transistor containing a metal oxide in a semiconductor layer. The metal oxide can function as an oxide semiconductor.

An oxide semiconductor is preferably used as the semiconductor of the transistor. The use of a semiconductor material having a wider band gap and lower carrier density than silicon is preferable because the off-state current of the transistor can be reduced.

The transistors 210a and 210b each include a conductive layer 201, an insulating layer 202, a conductive layer 203a, a conductive layer 203b, a semiconductor layer, a conductive layer 205, and an insulating layer 207. The transistor 210a further includes an insulating layer 206a and the transistor 210b further includes an insulating layer 206b. The conductive layer 201 functions as a gate. The conductive layer 205 functions as a back gate. The insulating layers 202, 206a, and 206b each function as a gate insulating layer. The semiconductor layer includes a channel formation region 204a and a pair of low-resistance regions 204b. The channel formation region 204a overlaps with the conductive layer 205 with the insulating layer 206a or 206b positioned therebetween. The channel formation region 204a overlaps with the conductive layer 201 with the insulating layer 202 positioned therebetween. The conductive layer 203a is electrically connected to one of the pair of low-resistance regions 204b through an opening in the insulating layer 207. Similarly, the conductive layer 203b is electrically connected to the other of the pair of low-resistance regions 204b. Various inorganic insulating films can be used for the insulating layers 202, 206a, 206b, and 207. In particular, an oxide insulating film is suitably used as an insulating film, which is in contact with the channel formation region 204a, of each of the insulating layers 202, 206a, and 206b, and a nitride insulating film is suitably used for the insulating layer 207.

The insulating layer 206b functioning as a gate insulating layer of the transistor 210b is thinner than the insulating layer 206a functioning as a gate insulating layer of the transistor 210a. A channel length Lb of the transistor 210b is shorter than a channel length La of the transistor 210a. Therefore, the transistor 210b can operate at a higher driving frequency than the transistor 210a and the transistor 210a can have a higher withstand voltage than the transistor 210b. Accordingly, in the display panel, the transistor 210a and the transistor 210b are preferably used for the pixel portion and the driver circuit, respectively.

Note that the display panel may be fabricated using only one of the transistors 210a and 210b. Alternatively, the display panel may be fabricated by combining one of the transistors 210a and 210b and another transistor.

The structure in which the semiconductor layer where a channel is formed is provided between two gates is used for the transistors 210a and 210b. It is preferable that the two gates be connected to each other and supplied with the same signal to operate the transistors. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can suppress display unevenness even in a display panel or a display device in which the number of wirings is increased because of an increase in size or resolution. Alternatively, by supplying a potential for controlling the threshold voltage to one of the two gates and a potential for driving to the other, the threshold voltage of the transistor can be controlled.

The metal oxide film functioning as a semiconductor layer can be formed using one or both of an inert gas and an oxygen gas. Note that there is no particular limitation on the flow rate ratio of oxygen (the partial pressure of oxygen) in the step of forming the metal oxide film. In the case where a transistor having high field-effect mobility is obtained, the flow rate ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide preferably contains at least indium or zinc. In particular, indium and zinc are preferably contained. Metal oxides will be described in Embodiment 4 in detail.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

A transistor 220 illustrated in FIG. 7B is a bottom-gate transistor containing a metal oxide in a semiconductor layer 204.

The transistor 220 includes the conductive layer 201, the insulating layer 202, the conductive layer 203a, the conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 positioned therebetween. The conductive layers 203a and 203b are electrically connected to the semiconductor layer 204. The transistor 220 is preferably covered with insulating layers 211 and 212. Various inorganic insulating films can be used for the insulating layers 211 and 212. In particular, an oxide insulating film is suitably used for the insulating layer 211, and a nitride insulating film is suitably used for the insulating layer 212.

A transistor 230 illustrated in FIG. 7C is a top-gate transistor containing low-temperature polysilicon (LTPS) in a semiconductor layer.

The transistor 230 includes the conductive layer 201, the insulating layer 202, the conductive layer 203a, the conductive layer 203b, the semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include a lightly doped drain (LDD) region. FIG. 7C illustrates an example in which an LDD region 214c is provided between the channel formation region 214a and the low-resistance region 214b. The channel formation region 214a overlaps with the conductive layer 201 with the insulating layer 202 positioned therebetween. The conductive layer 203a is electrically connected to one of the pair of low-resistance regions 214b through an opening in the insulating layer 202 and the insulating layer 213. Similarly, the conductive layer 203b is electrically connected to the other of the pair of low-resistance regions 214b. Various inorganic insulating films can be used for the insulating layer 213. In particular, a nitride insulating film is suitably used for the insulating layer 213.

A transistor 240 illustrated in FIG. 7D is a bottom-gate transistor containing hydrogenated amorphous silicon in a semiconductor layer 224.

The transistor 240 includes the conductive layer 201, the insulating layer 202, the conductive layer 203a, the conductive layer 203b, an impurity semiconductor layer 225, and the semiconductor layer 224. The conductive layer 201 functions as a gate. The insulating layer 202 functions as a gate insulating layer. The semiconductor layer 224 overlaps with the conductive layer 201 with the insulating layer 202 positioned therebetween. The conductive layers 203a and 203b are electrically connected to the semiconductor layer 224 through the impurity semiconductor layer 225. The transistor 240) is preferably covered with an insulating layer 226. Various inorganic insulating films can be used for the insulating layer 226. In particular, a nitride insulating film is suitably used for the insulating layer 226.

The display panel of this embodiment includes the insulating layer with a high barrier property over the light-emitting element as described above, so that entry of impurities into the light-emitting element can be prevented. Thus, deterioration of the light-emitting element can be suppressed and the reliability of the display panel can be improved. Furthermore, in the display panel, the auxiliary wiring of the common electrode of the light-emitting element is provided over the insulating layer, so that a drop in voltage due to the resistance of the common electrode can be inhibited. Accordingly, luminance unevenness of the display panel can be suppressed and the display quality of the display panel can be improved.

This embodiment can be combined with any of the other embodiments as appropriate. In the case where a plurality of structure examples are described in one embodiment in this specification, some of the structure examples can be combined as appropriate.

Embodiment 2

In this embodiment, a display panel of one embodiment of the present invention will be described with reference to FIGS. 8A to 8C and FIGS. 9A and 9B.

The display panel of this embodiment includes a first substrate, a transistor, a light-emitting element, a first insulating layer, a first inorganic insulating layer, a second inorganic insulating layer, a third inorganic insulating layer, a protective layer, and a bonding layer. The first substrate is flexible. The transistor overlaps with the first substrate with the first inorganic insulating layer positioned therebetween. A semiconductor layer of the transistor is positioned between the first inorganic insulating layer and the second inorganic insulating layer. The light-emitting element is positioned between the second inorganic insulating layer and the protective layer. The light-emitting element includes a first electrode, a light-emitting layer, and a second electrode. The light-emitting element emits light to the protective layer side. The first insulating layer includes a first opening overlapping with the first electrode. The first insulating layer covers an end portion of the first electrode. The light-emitting layer overlaps with the first electrode through the first opening. The second electrode is positioned over the light-emitting layer. The light-emitting element overlaps with the third inorganic insulating layer with the protective layer positioned therebetween. The third inorganic insulating layer overlaps with the light-emitting element with the bonding layer positioned therebetween. The protective layer is in contact with the second inorganic insulating layer more on the outside than an end portion of the first insulating layer. The display panel preferably further includes a conductive layer. The protective layer preferably includes a second opening overlapping with the first insulating layer and the conductive layer is preferably connected to the second electrode through the second opening.

In the display panel of this embodiment, the third inorganic insulating layer is provided on the display surface side (front surface side), the first inorganic insulating layer is provided on the rear surface side, and, on the side surface side of the display panel, the second inorganic insulating layer and the protective layer are in contact with each other more on the outside than the end portion of the first insulating layer. With such a structure, impurities such as moisture and oxygen are less likely to enter the light-emitting element from any of the display surface side, rear surface side, and side surface side of the display panel. Thus, deterioration of the light-emitting element can be suppressed and the reliability of the display panel can be improved.

Like the display panel described in Embodiment 1, the display panel of this embodiment includes the protective layer formed of a film with a high barrier property. The conductive layer functioning as an auxiliary wiring of the common electrode of the light-emitting element is preferably formed over the protective layer. Accordingly, a drop in voltage due to the resistance of the common electrode can be inhibited, whereby the luminance unevenness of the display panel can be suppressed and the display quality of the display panel can be improved.

Specific Example 5 of Display Panel

FIG. 8A is a cross-sectional view of a display panel 380A and FIG. 9A is a cross-sectional view of a display panel 380B. FIG. 8A and FIG. 9A correspond to cross-sectional views taken along dashed-dotted lines B1-B2 and B3-B4 in FIG. 2A. Description of portions in common with the display panel described in Embodiment 1 is omitted in some cases.

The display panel 380A is a top-emission display panel employing a color filter method. The display panel 380B is a top-emission display panel employing a separate coloring method.

The display panels 380A and 380B each include the substrate 361, the bonding layer 363, the insulating layer 365, the transistors 301, 302, and 303, the capacitor 305, the conductive layers 356 and 357, the insulating layer 314, the light-emitting element 110, the insulating layer 104, the protective layer 105, the auxiliary wiring 107, the bonding layer 317, the inorganic insulating layer 109, an insulating layer 375, a bonding layer 373, the substrate 371, and the like. The display panel 380A further includes the coloring layer 131 and the light-blocking layer 132.

The light-emitting element 110 includes the pixel electrode 111, the EL layer 112, and the common electrode 113. The pixel electrode 111 is electrically connected to the source or the drain of the transistor 303. They are directly connected to each other or connected via another conductive layer. The EL layer 112 of the display panel 380A is shared by a plurality of pixels. The EL layer 112 of the display panel 380B is provided for each light-emitting element 110. The end portion of the EL layer 112 is covered with the common electrode 113. The common electrode 113 covers the end portion of the EL layer 112 and is in contact with the insulating layer 104 more on the outside than the end portion of the EL layer 112. The light-emitting element 110 further includes the optical adjustment layer 114. With the light-emitting element 110 having a microcavity structure, light with high color purity can be extracted from the display panel.

The substrate 361 and the insulating layer 365 are bonded to each other with the bonding layer 363. The substrate 371 and the insulating layer 375 are bonded to each other with the bonding layer 373. In the fabrication of the display panel of this embodiment, first, the insulating layer 365, a transistor, the light-emitting element 110, and the like formed over a formation substrate and the insulating layer 375 (in the fabrication of the display panel 380A, the insulating layer 375, the coloring layer 131, and the light-blocking layer 132) formed over another formation substrate are bonded to each other with the bonding layer 317. Then, the two formation substrates are peeled, and the substrate 361 and the substrate 371 are bonded to surfaces exposed by peeling. The substrates 361 and 371 are preferably flexible, particularly preferably more flexible than the formation substrate.

The insulating layers 365 and 375 each include an inorganic insulating layer. Embodiment 1 can be referred to for the material of the inorganic insulating layer. In particular, a silicon nitride film, a silicon nitride oxide film, and an aluminum oxide film are suitably used for the insulating layers 365 and 375 because those films each have high moisture resistance. The insulating layers 365 and 375 are each formed over the formation substrate. By using a glass substrate or the like as the formation substrate, an inorganic insulating layer with high moisture resistance can be formed at high temperature.

The insulating layers 365 and 375 of the display panel of this embodiment each include an inorganic insulating layer. With such a structure, impurities are less likely to enter the display panel from the display surface (front surface) and the rear surface of the display panel, whereby deterioration of the transistor and the light-emitting element 110 can be suppressed.

The insulating layer 104 covers the end portion of the pixel electrode 111 and the end portion of the optical adjustment layer 114. Two adjacent pixel electrodes 111 are electrically insulated from each other by the insulating layer 104.

The protective layer 105 covers the end portion of the common electrode 113 in the connection portion 75 and is in contact with the insulating layer 104 and the inorganic insulating layer 109 more on the outside than the end portion of the common electrode 113. With such a structure, entry of impurities into the common electrode 113 can be prevented.

The protective layer 105 and the inorganic insulating layer 109 cover the end portion of the insulating layer 314 and the end portion of the insulating layer 104 at and in the vicinity of the end portion of the display panel 380A, and the protective layer 105 is in contact with the insulating layer 313 more on the outside than the end portion of the insulating layer 314 and the end portion of the insulating layer 104. In addition, the protective layer 105 and the inorganic insulating layer 109 cover the end portion of the insulating layer 314 and the end portion of the insulating layer 104 at and in the vicinity of the end portion of the display panel 380B, and the protective layer 105 is in contact with the insulating layer 312 more on the outside than the end portion of the insulating layer 314 and the end portion of the insulating layer 104.

The protective layer 105 is preferably in contact with any of the inorganic insulating layers functioning as a gate insulating layer of the transistor or a protective layer. In FIG. 8A and FIG. 9A, the insulating layer 312 or 313 that is a gate insulating layer (also referred to as a back gate insulating layer) of the transistor and the protective layer 105 are in contact with each other, for example. Alternatively, the protective layer 105 may be in contact with any of the insulating layers 202 and 207 illustrated in FIG. 7A1, the insulating layers 211 and 212 illustrated in FIG. 7B, the insulating layers 202 and 213 illustrated in FIG. 7C, the insulating layers 202 and 226 illustrated in FIG. 7D, and the like.

The protective layer 105 is preferably in contact with one of the gate insulating layer of the transistor and the protective layer that has the higher water resistance of the two, for example. With such a structure, the water resistance on the side surface of the display panel can be improved.

A structure in which the protective layer 105 that is a nitride film and a nitride film are in contact with each other (e.g., a structure in which silicon nitride films are in contact with each other) or a structure in which the protective layer 105 that is an oxide film and an oxide film (oxynitride film) are in contact with each other (e.g., a structure in which a silicon oxynitride film and an aluminum oxide film are in contact with each other) is preferable. With such a structure in which adhesion between two layers is high, the water resistance on the side surface of the display panel can be improved.

In the display panel of this embodiment, the variety of insulating layers and the protective layer 105 are provided so that the end portion of an inorganic film (or an inorganic insulating film) is positioned more on the outside than the end portion of an organic film and inorganic films (or inorganic insulating films) are stacked in contact with each other at and in the vicinity of the end portion of the display panel. With such a structure, impurities are less likely to enter the display panel from the side surface of the display panel, whereby deterioration of the transistor and the light-emitting element 110 can be suppressed.

The auxiliary wiring 107 is electrically connected to the common electrode 113 through the opening in the protective layer 105. The opening in the protective layer 105 is provided over the insulating layer 104. The auxiliary wiring 107 is covered with the inorganic insulating layer 109.

FIGS. 8B and 8C and FIG. 9B illustrate modification examples of the end portion of the display panel and the vicinity thereof. In FIGS. 8B and 8C, the opening 308 reaching the insulating layer 313 is provided in the insulating layer 314, and the insulating layer 313 and the protective layer 105 are in contact with each other in the opening 308. As described above, when an organic insulating film has an opening and inorganic films (or inorganic insulating films) are in contact with each other in the opening, impurities are less likely to enter the display panel from the side surface of the display panel, whereby deterioration of the transistor and the light-emitting element 110 can be suppressed even in the case where the organic insulating film extends to the end portion of the display panel.

In FIG. 8B, the conductive layer 307 is electrically connected to the FPC 74 through the conductive layer 355 and the connector 319.

In FIG. 9B, the common electrode 113 covers the end portion of the insulating layer 314 and the end portion of the insulating layer 104, and is in contact with the insulating layer 312 more on the outside than the end portion of the insulating layer 314 and the end portion of the insulating layer 104. For the common electrode 113, an inorganic material that can be used for the protective layer 105 such as ITO can be used. That is, the common electrode 113 can also function as a protective layer. The common electrode 113 and the insulating layer 312 are in contact with each other, so that entry of impurities from the side surface of the display panel can be prevented. As illustrated in FIG. 9B, the protective layer 105 and the insulating layer 312 are preferably in contact with each other more on the outside than the end portion of the common electrode 113.

As described above, the display panel of this embodiment includes four inorganic layers: the insulating layer 365, the insulating layer 375, the inorganic insulating layer (a gate insulating layer or a protective layer) on the transistor side, and the protective layer 105, so that entry of impurities from the front surface, rear surface, and side surface of the display panel is prevented and the reliability of the display panel is improved.

This embodiment can be combined with any of the other embodiments and an example as appropriate.

Embodiment 3

In this embodiment, a display panel and a display device of one embodiment of the present invention will be described with reference to FIGS. 10A to 10D, FIGS. 11A and 11B, FIGS. 12A to 12D, FIGS. 13A to 13C, FIGS. 14A to 14C, and FIG. 15.

The display panel of this embodiment includes a display region, a first terminal region, and a second terminal region. The first terminal region is provided so as not to block the display region and includes a region overlapping with the display region. The first terminal region includes a first group of terminals and the first group of terminals includes a first terminal. The second terminal region includes a second group of terminals and the second group of terminals includes a second terminal. The display region includes one group of pixels, another group of pixels, a scan line, and a signal line. The one group of pixels includes pixels and is arranged in a row direction. The other group of pixels includes pixels and is arranged in a column direction intersecting the row direction. The scan line is electrically connected to the one group of pixels. The signal line is electrically connected to the other group of pixels. The signal line is electrically connected to the first terminal and the second terminal.

With such a structure, one of the first terminal and the second terminal can supply a signal supplied from the other of the first terminal and the second terminal to another terminal, for example. Alternatively, the signal supplied from one of the first terminal and the second terminal can be distributed to the other of the first terminal and the second terminal and the other group of pixels, for example.

Figure 10A:
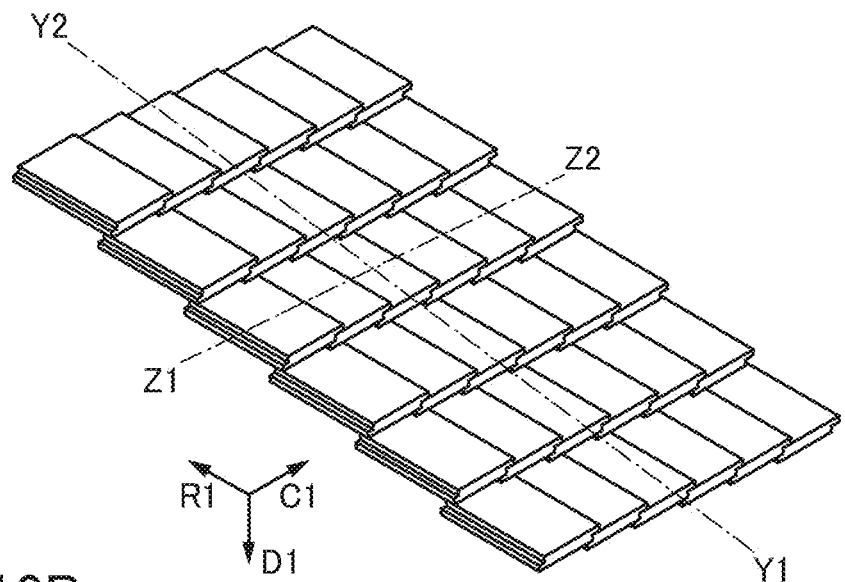
FIGS. 10A to 10D are a perspective view, a top view, and cross-sectional views illustrating an arrangement example of display panels.
Figure 10B:
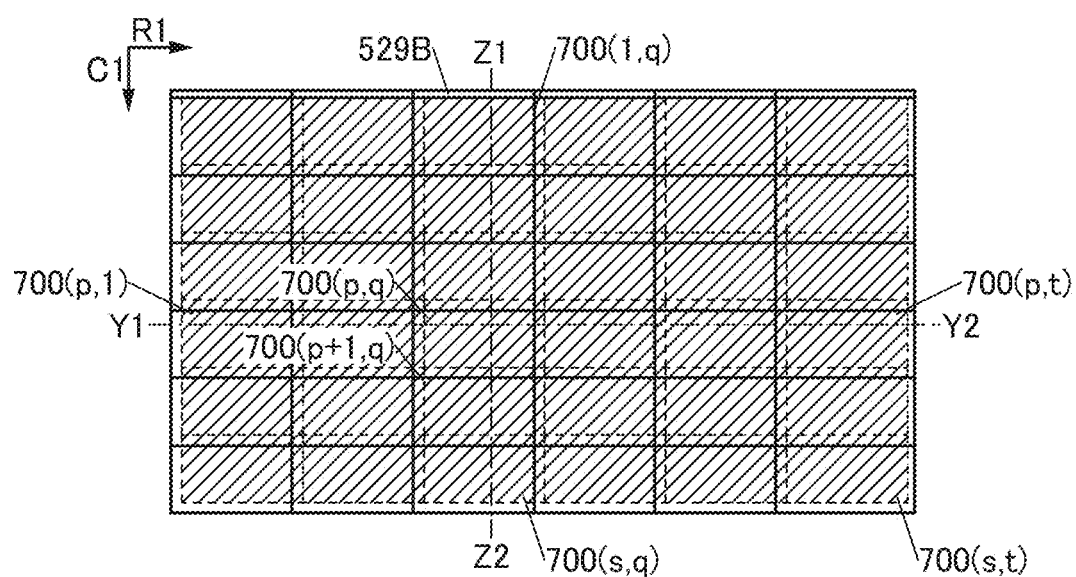
Figure 10C:
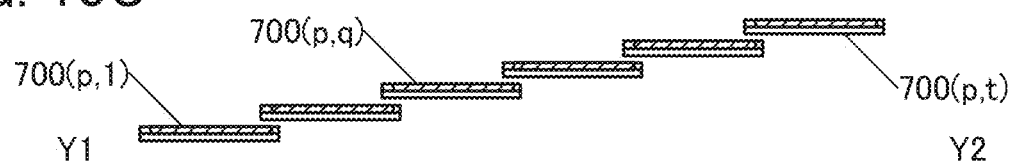
Figure 10D:
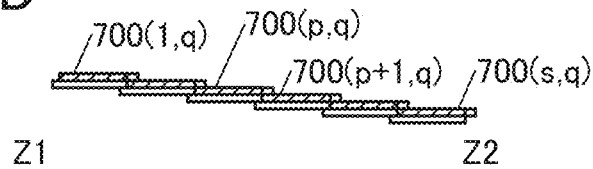

FIG. 10A is a perspective view of a display device including a plurality of display panels. FIG. 10B is a top view of the display device. FIG. 10C is a cross-sectional view taken along dashed-dotted line Y1-Y2 in FIGS. 10A and 10B. FIG. 10D is a cross-sectional view taken along dashed-dotted line Z1-Z2 in FIGS. 10A and 10B.

Figure 11A:
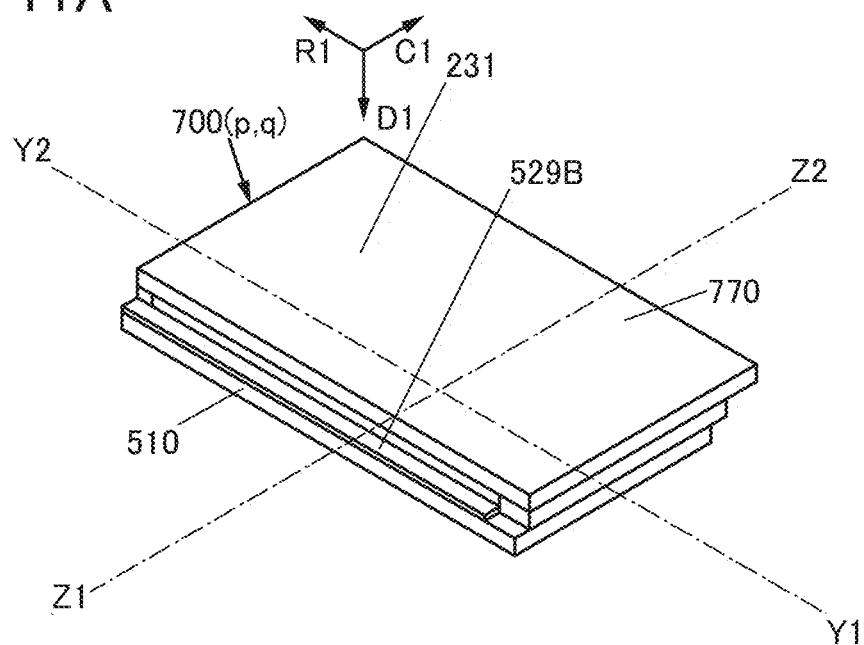
FIGS. 11A and 11B are perspective views illustrating an example of a display panel.
Figure 11B:
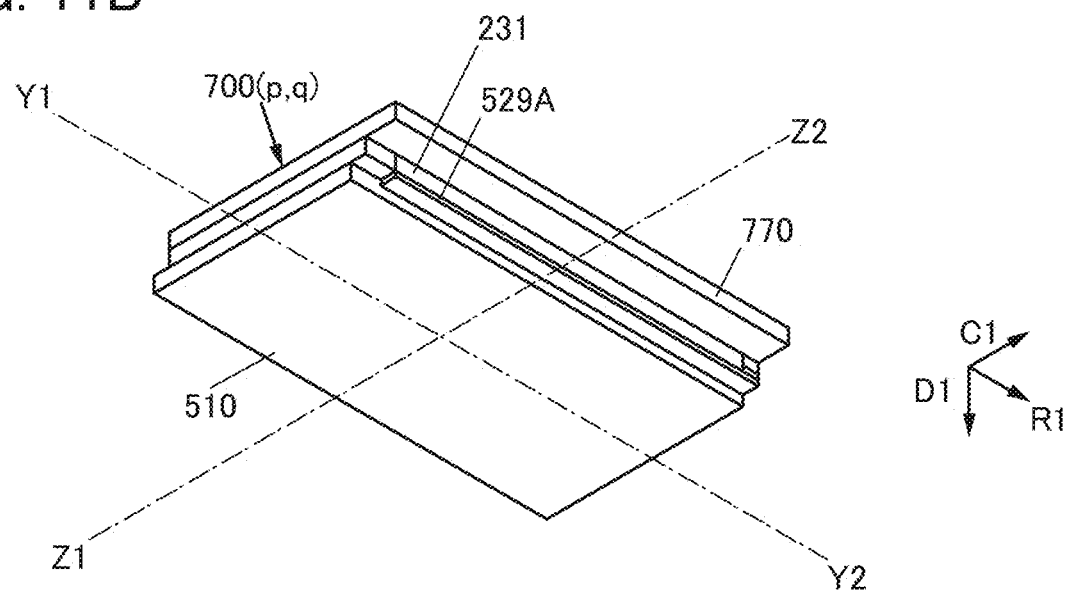

FIG. 11A is a perspective view of one display panel seen obliquely from above and FIG. 11B is a perspective view of the display panel seen obliquely from below.

Figure 12A:
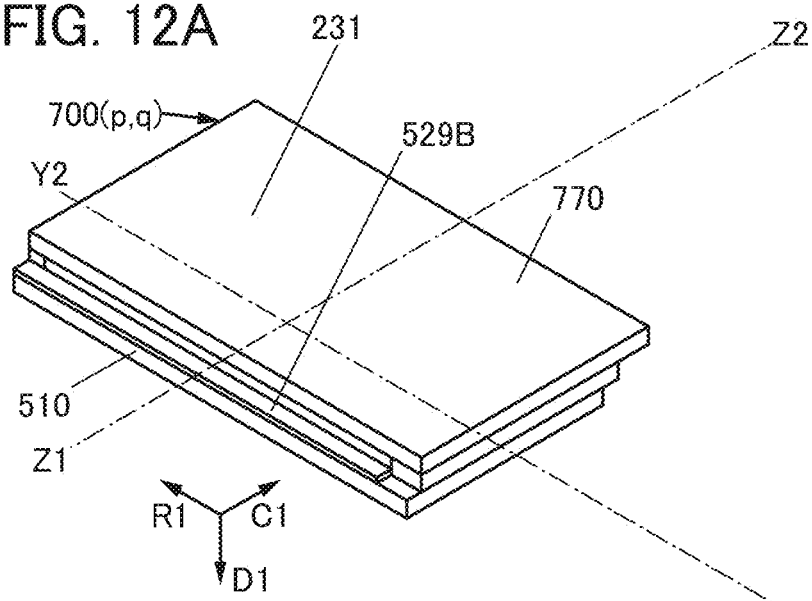
FIGS. 12A to 12D are a perspective view, a top view, and cross-sectional views illustrating an example of a display panel.
Figure 12B:
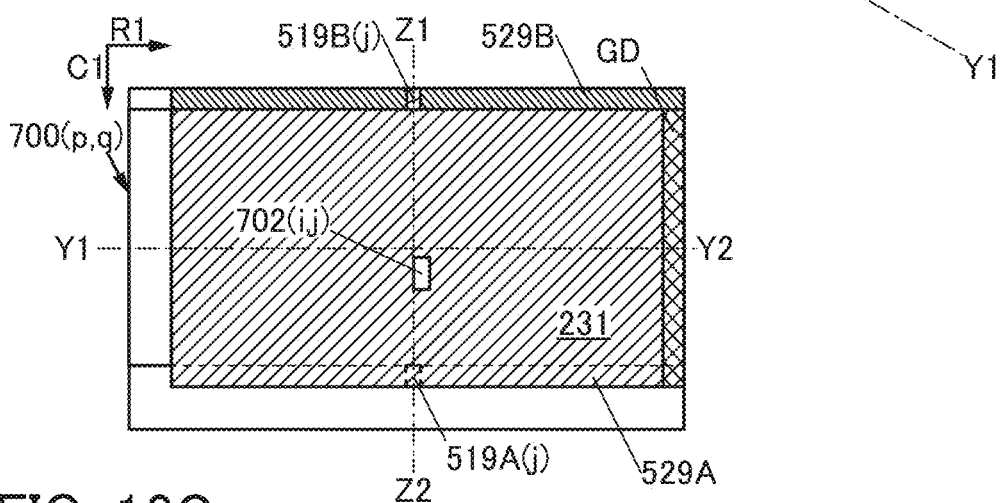
Figure 12C:
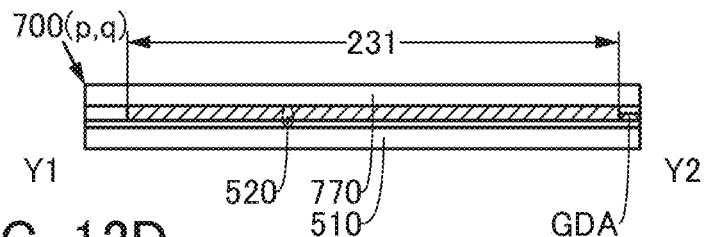
Figure 12D:
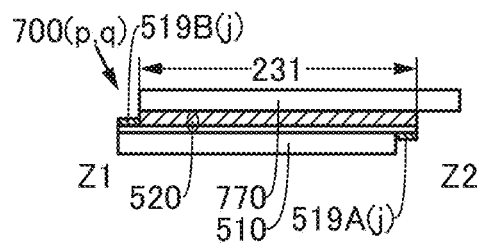

FIG. 12A is a perspective view of one display panel. FIG. 12B is a top view of the display panel. FIG. 12C is a cross-sectional view taken along dashed-dotted line Y1-Y2 in FIGS. 12A and 12B. FIG. 12D is a cross-sectional view taken along dashed-dotted line Z1-Z2 in FIGS. 12A and 12B.

Figure 13A:
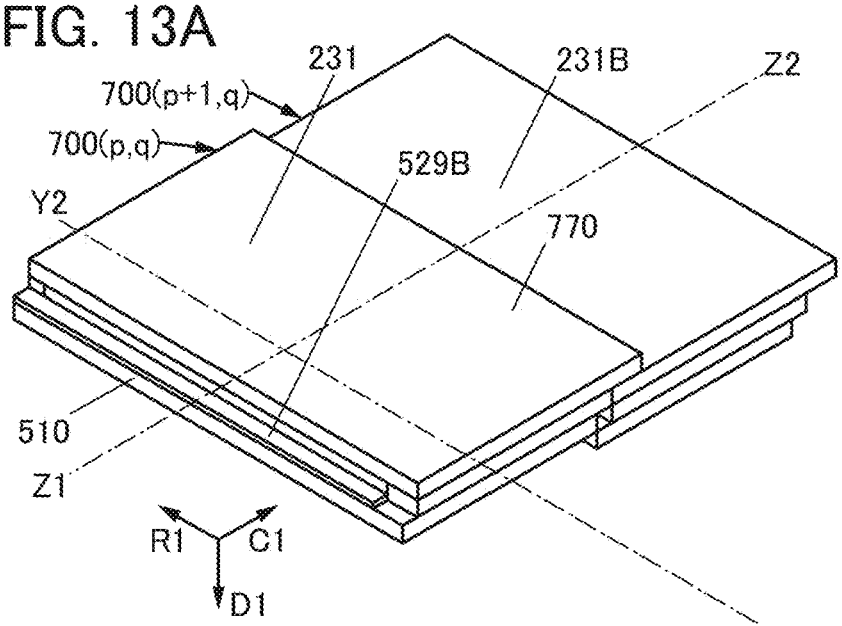
FIGS. 13A to 13C are a perspective view, a top view, and a cross-sectional view illustrating an arrangement example of display panels.
Figure 13B:
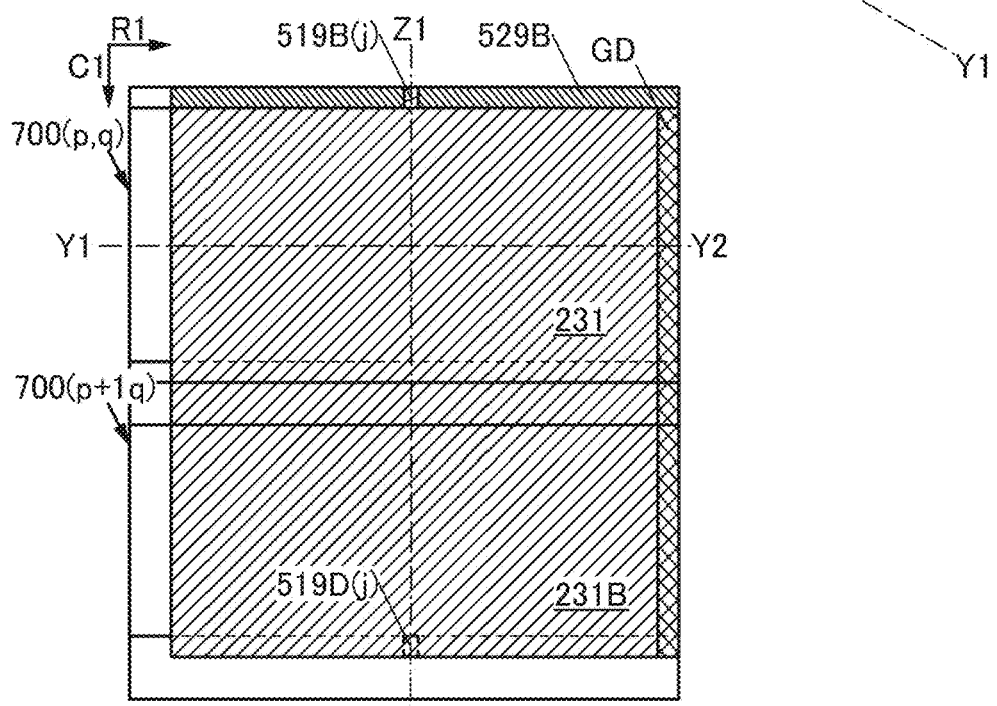
Figure 13C:
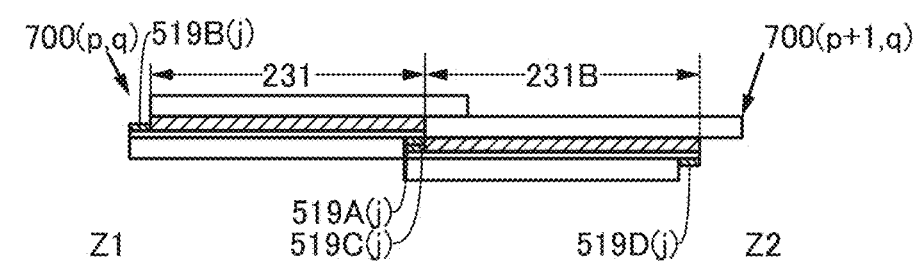

FIG. 13A is a perspective view of two display panels arranged in a direction indicated by an arrow C1. FIG. 13B is a top view of the two display panels. FIG. 13C is a cross-sectional view taken along dashed-dotted line Z1-Z2 in FIGS. 13A and 13B.

Figure 14A:
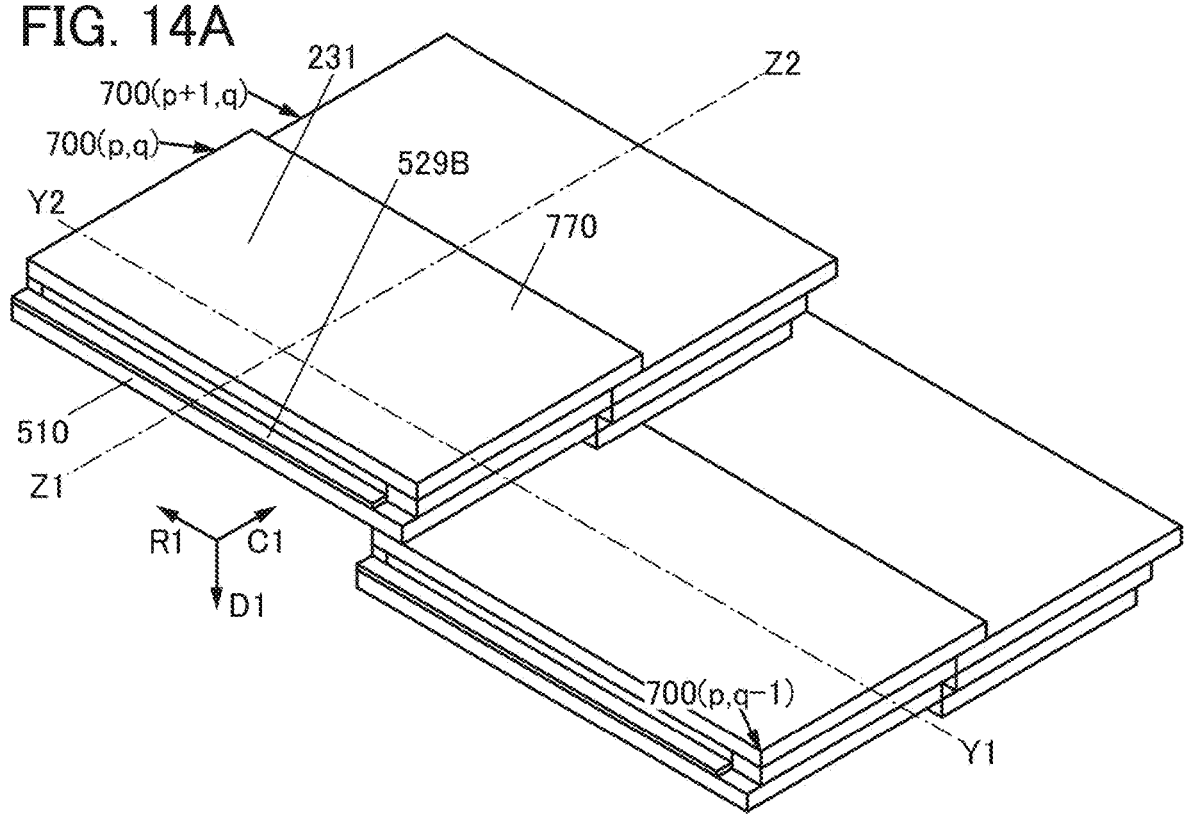
FIGS. 14A to 14C are a perspective view, a top view, and a cross-sectional view illustrating an arrangement example of display panels.
Figure 14B:
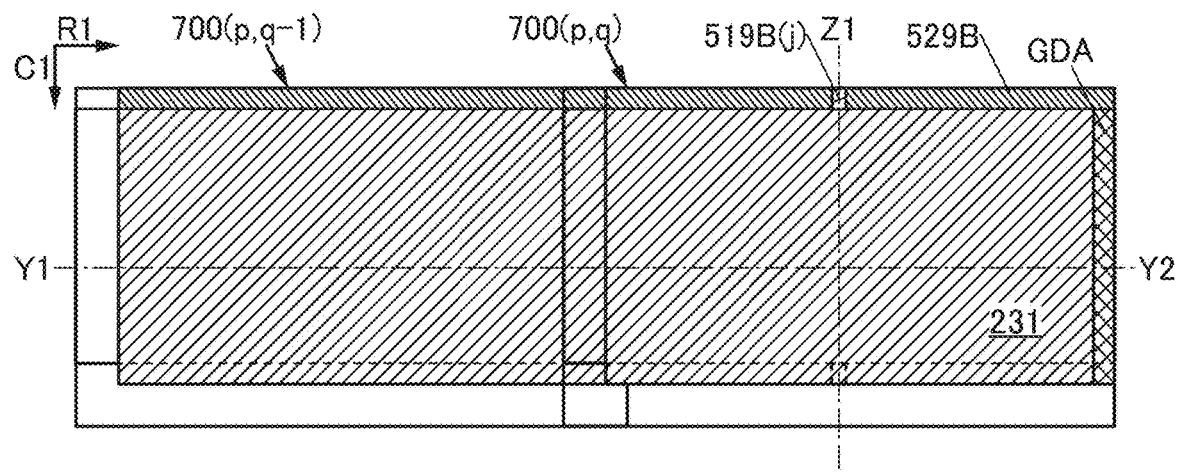
Figure 14C:
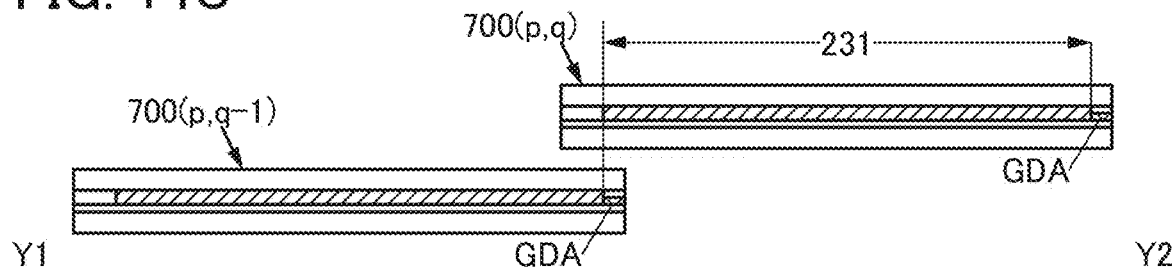

FIG. 14A is a perspective view of four display panels. FIG. 14B is a top view of two display panels arranged in a direction indicated by an arrow R1. FIG. 14C is a cross-sectional view taken along dashed-dotted line Y1-Y2 in FIGS. 14A and 14B.

Figure 15:
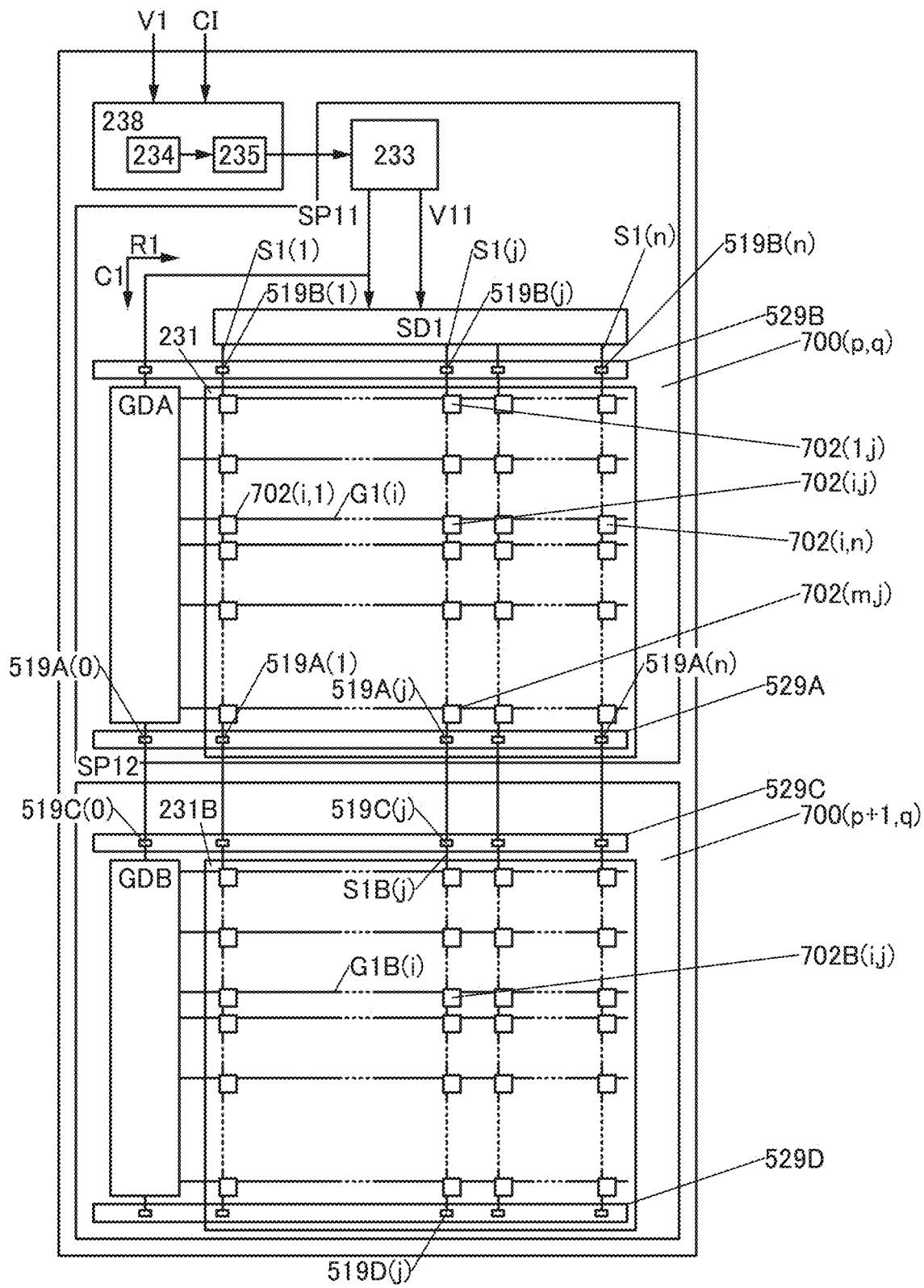
FIG. 15 is a block diagram showing an example of a display device.

FIG. 15 is a block diagram of the display device.

Note that in this specification, an integral variable of 1 or more may be used for reference numerals. For example, "(p)" where p is an integral value of 1 or more may be used for part of a reference numeral that specifies any one of components (p components at a maximum). For another example, "(m,n)" where each of m and n is an integral value of 1 or more may be used for part of a reference numeral that specifies any one of components (m×n components at a maximum).

<Display Panel 700(p,q)>

A display panel 700(p,q) illustrated in FIGS. 11A and 11B and FIGS. 12A to 12D includes a display region 231, a terminal region 529A, and a terminal region 529B.

The display panel 700(p,q) includes a base 510, a base 770, and a functional layer 520. The functional layer 520 includes a region sandwiched between the base 510 and the base 770. The functional layer 520 includes a display element, a transistor, and the like.

<<Terminal Region 529A>>

The terminal region 529A is provided so as not to block the display region 231 and includes a region overlapping with the display region 231. Specifically, the terminal region 529A is provided on the depth direction (a direction indicated by an arrow DI in the drawing) side of the display region 231 (see FIG. 11B). The display region 231 performs display in a direction opposite to the depth direction. That is, the terminal region 529A is provided on the back side of the display region 231. Accordingly, the terminal region 529A can be provided so as to overlap with the display region 231 without blocking display of the display region 231.

The terminal region 529A includes one group of terminals 519A(1) to 519A(n) and the one group of terminals 519A(1) to 519A(n) includes a terminal 519A(j) (see FIG. 15).

<<Terminal Region 529B>>

The terminal region 529B includes one group of terminals 519B(1) to 519B(n) and the one group of terminals 519B(1)

to 519B(*n*) includes a terminal 519B(*j*). The terminal region 529B is provided outside the display region 231 (see FIG. 11A).

<<Display Region 231>>

The display region 231 includes one group of pixels 702(*i*,1) to 702(*i*,*n*), another group of pixels 702(1,*j*) to 702(*m*,*j*), a scan line G1(*i*), and a signal line S1(*j*) (see FIG. 15).

The one group of pixels 702(*i*,1) to 702(*i*,*n*) includes a pixel 702(*i*,*j*) and is arranged in a row direction (indicated by an arrow R1 in the drawing).

The other group of pixels 702(1,*j*) to 702(*m*,*j*) includes the pixel 702(*i*,*j*) and is arranged in a column direction (indicated by an arrow C1 in the drawing) intersecting the row direction.

<<Scan Line G1(*i*)>>

The scan line G1(*i*) is electrically connected to the one group of pixels 702(*i*,1) to 702(*i*,*n*).

<<Signal Line S1(*j*)>>

The signal line S1(*j*) is electrically connected to the other group of pixels 702(1,*j*) to 702(*m*,*j*), the terminal 519A(*j*), and the terminal 519B(*j*).

With such a structure, one of the terminal 519A(*j*) and the terminal 519B(*j*) can supply a signal supplied from the other of the terminal 519A(*j*) and the terminal 519B(*j*) to another terminal, for example. Alternatively, the signal supplied from one of the terminal 519A(*j*) and the terminal 519B(*j*) can be distributed to the other of the terminal 519A(*j*) and the terminal 519B(*j*) and the other group of pixels 702(1,*j*) to 702(*m*,*j*), for example.

The terminal 519A(*j*) can be provided without reducing the display quality. The terminal 519A(*j*) can be hidden from a user. The light-transmitting property of a region outside the display region 231 is not reduced. The display region 231 can be close to another object. The display region 231 can be aligned to the other object. The display region 231 can be adjacent to a display region of another display panel. Consequently, a novel display panel that is highly convenient or reliable can be provided.

The signal line S1(*j*) includes a first region, a second region, and a third region. The third region is sandwiched between the first region and the second region.

The signal line S1(*j*) is electrically connected to the terminal 519A(*j*) in the first region and the terminal 519B(*j*) in the second region (see FIG. 15). Furthermore, the signal line S10) is electrically connected to the pixel 702(*i*,*j*) in the third region.

With such a structure, the terminal 519A(*j*), the terminal 519B(*j*), and the pixel 702(*i*,*j*) can be electrically connected to one end of the signal line S1(*j*), the other end of the signal line S1(*j*), and a region between the one end and the other end of the signal line S1(*j*), respectively, for example.

A signal other than a signal supplied from one of the terminal 519A(*j*) and the terminal 519B(*j*) and containing image data to be displayed on the other group of pixels 702(1,*j*) to 702(*m*,*j*) can be supplied from the other of the terminal 519A(*j*) and the terminal 519B(*j*). The signal containing image data not to be displayed on the display panel can be transmitted through a signal line. Consequently, a novel display panel that is highly convenient or reliable can be provided.

The display panel 700(*p*,*q*) preferably includes a driver circuit GDA and a driver circuit SD1 (see FIG. 15).

<<Driver Circuit GDA>>

The driver circuit GDA is electrically connected to the scan line G1(*i*) and has a function of supplying a selection signal.

The driver circuit GDA includes a shift register and a latch circuit. For example, a transistor having the same structure as the transistor used for the display region 231 can be used for the driver circuit GDA. Therefore, the driver circuit GDA and the display region 231 can be formed in the same step.

The transistor used for the driver circuit GDA can be designed to have such a size and the like that the transistor operates at a higher speed than the transistor used for the display region 231.

The driver circuit GDA preferably has a function of supplying a selection signal to the scan line G1(*i*) with a frequency of higher than or equal to 30 Hz. The driver circuit GDA preferably has a function of supplying a selection signal with various frequencies. For example, the driver circuit GDA has a function of supplying a selection signal to the scan line G1(*i*) with a frequency of lower than or equal to 1 Hz or higher than or equal to 30 Hz.

<<Driver Circuit SD1>>

The driver circuit SD1 is electrically connected to the terminal 519B(*j*) and has a function of supplying an image signal.

Thus, a signal containing image data to be displayed on one display panel and a signal containing image data to be displayed on another display panel can be supplied to the terminal 519B(*j*), for example. The signal containing image data to be displayed on another display panel can be supplied from the terminal 519A(*j*) to the terminal 519B(*j*), for example. Consequently, a novel display panel that is highly convenient or reliable can be provided.

The driver circuit SD1 includes a shift register, a latch circuit, a D/A converter circuit, a buffer amplifier, and the like. The D/A converter circuit includes, for example, a logic circuit including a resistor string and a pass transistor.

A transistor using single crystal silicon as a semiconductor can be used for the driver circuit SD1, for example. Alternatively, a transistor using an oxide semiconductor film can be used for the driver circuit SD1, for example.

A transistor using an oxide semiconductor film can be used as a pass transistor of a logic circuit, for example. Therefore, the surface unevenness of a semiconductor film can be smaller than that of a polysilicon film on which ridges are formed by laser crystallization, for example. A thin insulating film having a thickness of about 20 nm or the like can be used for a gate insulating layer. The drive capability of the transistor using an oxide semiconductor film can be improved. A logic circuit or the like formed of the transistor using an oxide semiconductor film can operate at a higher speed than a logic circuit or the like formed of a transistor using polysilicon.

Structure Example 1 of Display Device

The display device described in this embodiment includes one group of display panels 700(*p*,1) to 700(*p*,*t*) and another group of display panels 700(1,*q*) to 700(*s*,*q*) (see FIG. 10B). Although a structure in which display panels are arranged in a matrix of six rows and six columns is illustrated for describing an example of a structure in which display panels are arranged in a matrix of s rows and t columns, the display device of one embodiment of the present invention is not limited to the structure.

The one group of display panels 700(*p*,1) to 700(*p*,*t*) is arranged in a row direction and includes the display panel 700(*p*,*q*).

The other group of display panels 700(1,*q*) to 700(*s*,*q*) is arranged in a column direction intersecting the row direction and includes the display panel 700(*p*,*q*) and a display panel 700(*p*+1,*q*).

Structure Example 2 of Display Device

Another structure example of the display device described in this embodiment includes the display panel 700(*p*,*q*) and the display panel 700(*p*+1,*q*) (see FIG. 15). Although a structure in which display panels are arranged in a matrix of two rows and one column is illustrated for describing an example of a structure in which display panels are arranged in a matrix of s rows and t columns, the display device of one embodiment of the present invention is not limited to the structure.

The display panel 700(*p*,*q*) and the display panel 700(*p*+1,*q*) are arranged in a column direction (a direction indicated by the arrow C1 in the drawing).

<<Display Panel 700(*p*+1,*q*)>>

The display panel 700(*p*+1,*q*) includes a terminal region 529C and the display region 231B.

<<Terminal Region 529C>>

The terminal region 529C is provided outside the display region 231B and includes a region overlapping with the terminal region 529A.

The terminal region 529C includes one group of terminals 519C(1) to 519C(*n*) and the one group of terminals 519C(1) to 519C(*n*) includes a terminal 519C(*j*).

The terminal 519C(*j*) is electrically connected to the terminal 519A(*j*) and the display region 231B is provided so that display of the display region 231B can be seen from a direction from which display of the display region 231 can be seen.

With such a structure, display panels of the one group can be arranged close to each other. Display regions of the display panels of the one group can be arranged continuously. Display panels of the other group can be arranged close to each other. Display regions of the display panels of the other group can be arranged continuously.

A continuous image can be displayed on the one group of display panels. A continuous image can be displayed on the other group of display panels.

A signal supplied to a second terminal of the one display panel and containing image data to be displayed on another display panel can be supplied from a first terminal of the one display panel to a third terminal of the other display panel. Consequently, a novel display device that is highly convenient or reliable can be provided.

The display panel 700(*p*+1,*q*) preferably includes a terminal region 529D.

<<Terminal Region 529D>>

The terminal region 529D is provided so as not to block the display region 231B and includes a region overlapping with the display region 231B. For example, the terminal region 529D can be provided in the display region 231B in the same manner as the terminal region 529A in the display region 231. That is, the terminal region 529D is provided on the rear surface of the display region 231B.

The terminal region 529D includes one group of terminals 519D(1) to 519D(*n*) and the one group of terminals 519D(1) to 519D(*n*) includes a terminal 519D(*j*).

<<Display Region 231B>>

The display region 231B includes a pixel 702B(*i*,*j*) and a signal line S1B(*j*).

The signal line S1B(*j*) is electrically connected to the pixel 702B(*i*,*j*), the terminal 519C(*j*), and the terminal 519D(*j*).

With such a structure, a fourth terminal can supply a signal supplied from a third terminal, for example. Alternatively, the signal supplied from the third terminal can be distributed to the fourth terminal and another pixel, for example.

The fourth terminal can be provided without reducing the display quality. The fourth terminal can be hidden from a user. The light-transmitting property of a region outside another display region is not reduced. The other display region can be close to another object. The other display region can be aligned to the other object. Consequently, a novel display device that is highly convenient or reliable can be provided.

Structure Example 3 of Display Device

The display device of one embodiment of the present invention preferably includes a control portion 238 (see FIG. 15).

<<Control Portion 238>>

The control portion 238 is supplied with image data V1 and control data CI.

The control portion 238 generates data V11 on the basis of the image data V1 and generates a control signal SP11 on the basis of the control data CI. The control portion 238 supplies the data V11 and the control signal SP11.

Specifically, the control portion 238 includes a control circuit 233, a decompression circuit 234, and an image processing circuit 235.

<<Control Circuit 233>>

The control circuit 233 has a function of generating and supplying the control signal SP11.

The control circuit 233 has a function of supplying the control signal SP11. For example, a clock signal or a timing signal can be used for the control signal SP11. Specifically, a start pulse for starting operation of the driver circuit GDA or the driver circuit SD1 can be used for the control signal SP11. Thus, a plurality of driver circuits can be driven in synchronization with each other.

A timing controller can be used for the control circuit 233, for example.

Note that the control circuit 233 can be included in the display panel. The control circuit 233 mounted on a rigid substrate can be used for the display panel, for example. The control circuit 233 mounted on the rigid substrate can be electrically connected to the driver circuit with the use of a flexible printed circuit.

Specifically, the control circuit 233 mounted on the rigid substrate can be electrically connected to the driver circuit GDA. Furthermore, the control circuit 233 mounted on the rigid substrate can be electrically connected to the driver circuit SD1.

<<Decompression Circuit 234>>

The decompression circuit 234 has a function of decompressing the image data V1 which is supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data contained in the image data V1, for example.

The image processing circuit 235 has a function of generating the data V11 by correcting the image data V1 on the basis of a predetermined characteristics curve and a function of supplying the data V11, for example.

The driver circuit GDA generates a selection signal and a control signal SP12 on the basis of the control signal SP11.

The driver circuit GDA supplies the selection signal and the control signal SP12.

The driver circuit SD1 supplies an image signal on the basis of the data V11.

The terminal region 529A includes a terminal 519A(0). The terminal 519A(0) is electrically connected to the driver circuit GDA and supplied with the control signal SP12.

The terminal region 529C includes a terminal 519C(0). The terminal 519C(0) is electrically connected to the terminal 519A(0).

The display panel 700($p+1,q$) preferably includes a driver circuit GDB and a scan line G1B($j$).

<<Driver Circuit GDB>>

The driver circuit GDB is electrically connected to the terminal 519C(0) and a scan line G1B($i$).

The driver circuit GDB generates another selection signal on the basis of the control signal SP12 and supplies the signal.

<<Pixel 702B($i,j$)>>

The pixel 702B($i,j$) is electrically connected to the scan line G1B($i$) and the signal line S1B($j$).

The pixel 702B($i,j$) is supplied with the data V11 and the other selection signal.

Thus, first to third driver circuits can be driven in synchronization with each other. The one group of display panels can display a continuous image in synchronization with each other. The other group of display panels can display a continuous image in synchronization with each other. Consequently, a novel display device that is highly convenient or reliable can be provided.

This embodiment can be combined with any of the other embodiments and an example as appropriate.

Embodiment 4

Described in this embodiment is a metal oxide that can be used in a transistor disclosed in one embodiment of the present invention. In particular, details of a metal oxide and a cloud-aligned composite (CAC)-OS are described below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function.

In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (µ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (µ) can be achieved.

A semiconductor element including a CAC-OS has high reliability. Thus, the CAC-OS is suitably used in a variety of semiconductor devices typified by a display.

This embodiment can be combined with any of the other embodiments and an example as appropriate.

Embodiment 5

In this embodiment, electronic devices of one embodiment of the present invention will be described with reference to FIGS. 16A to 16D.

Electronic devices of this embodiment are provided with a display panel or a display device of one embodiment of the present invention. Therefore, a display portion of the electronic devices can display a high-quality picture.

The display portion of the electronic devices of this embodiment can display, for example, an image with a resolution of full high definition, 2 K, 4 K, 8 K, 16 K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include electronic devices with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 16A:
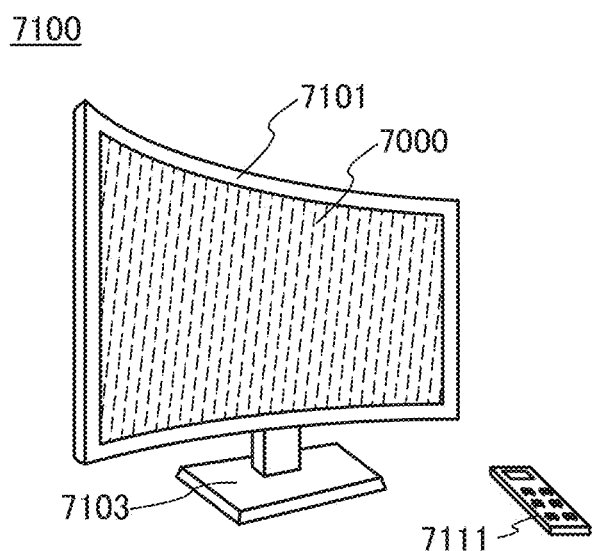
FIGS. 16A to 16D illustrate examples of electronic devices.

FIG. 16A illustrates an example of a television device. In a television device 7100, a display portion 7000 is incorporated in a housing 7101. Here, the housing 7101 is supported by a stand 7103.

The display panel or the display device of one embodiment of the present invention can be used in the display portion 7000.

The television device 7100 illustrated in FIG. 16A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying data output from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 16B:
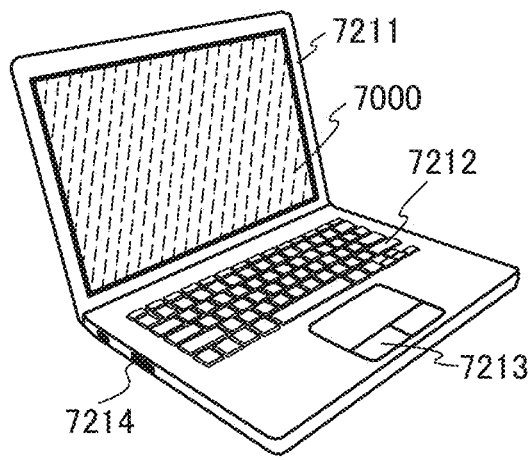

FIG. 16B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display panel or the display device of one embodiment of the present invention can be used in the display portion 7000.

Figure 16C:
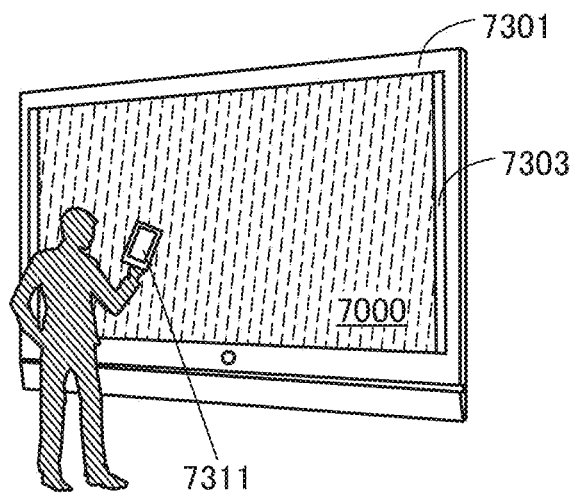
Figure 16D:
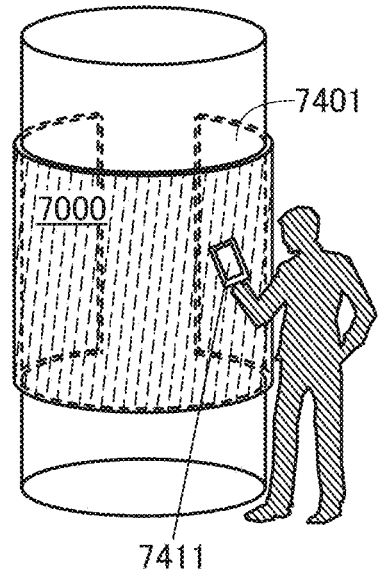

FIGS. 16C and 16D illustrate examples of digital signage.

A digital signage 7300 illustrated in FIG. 16C includes a housing 7301, the display portion 7000, a speaker 7303, and the like. Also, the digital signage can include an LED lamp, operation keys (including a power switch or an operation switch), a connection terminal, a variety of sensors, a microphone, and the like.

FIG. 16D illustrates a digital signage 7400 mounted on a cylindrical pillar 7401. The digital signage 7400 includes the display portion 7000) provided along a curved surface of the pillar 7401.

The display panel or the display device of one embodiment of the present invention can be used for each of the display portions 7000 illustrated in FIGS. 16C and 16D.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIGS. 16C and 16D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or 7411. Moreover, by operation of the information terminal 7311 or 7411, a displayed image on the display portion 7000 can be switched.

Furthermore, it is possible to make the digital signage 7300 or 7400 execute a game with use of the screen of the information terminal 7311 or 7411 as an operation means (controller). Thus, an unspecified number of people can join in and enjoy the game concurrently.

This embodiment can be combined with any of the other embodiments as appropriate.

Example 1

The observation results of the cross section of a display panel of one embodiment of the present invention will be described in this example.

Figure 17:
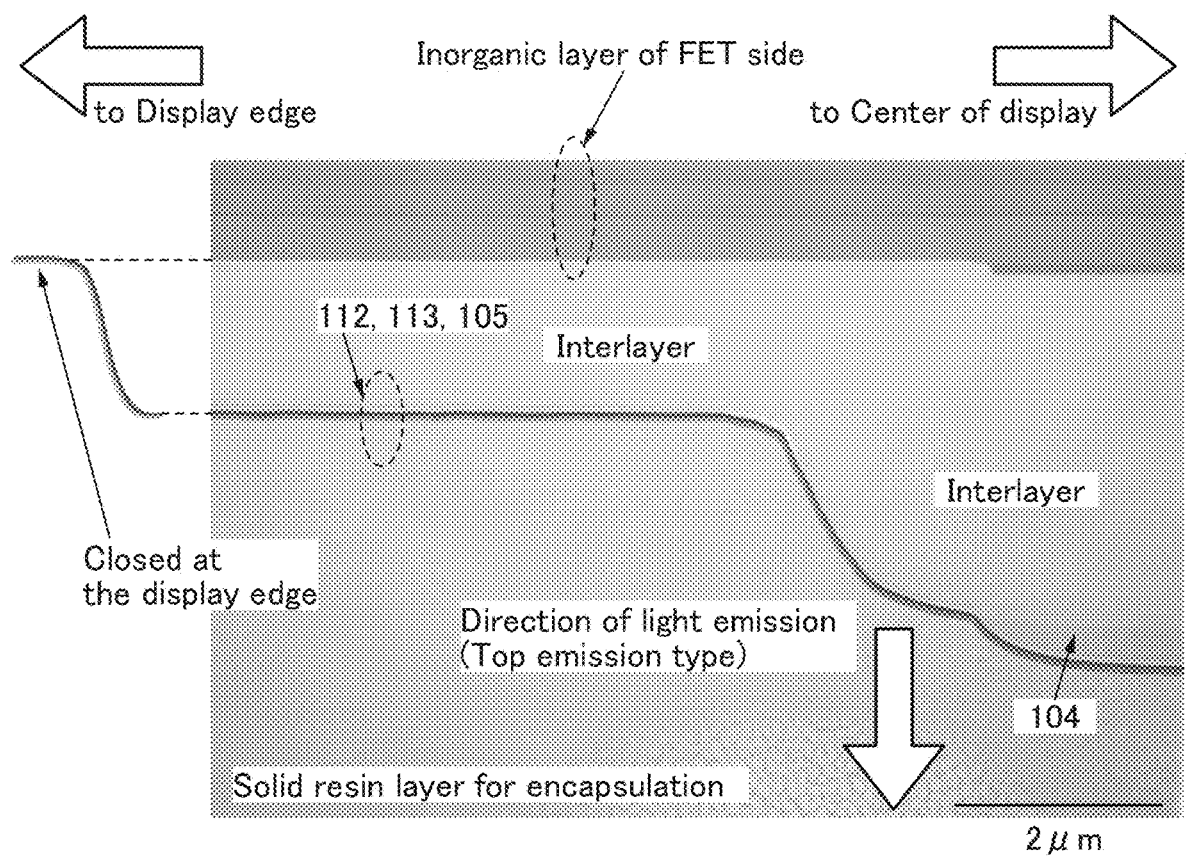
FIG. 17 is a cross-sectional photograph of a display panel of Example 1.

The rear surface side and the display surface side of the display panel are respectively shown in an upper part and a lower part of a cross-sectional photograph shown in FIG. 17.

An interlayer (Interlayer) corresponds to the insulating layer 314 having a planarizing function illustrated in FIG. 9A and the like. That is, the insulating layer 314 shown in FIG. 17 has a two-layer structure.

The EL layer 112, the common electrode 113, and the protective layer 105 are stacked from the interlayer side.

An ITO film was formed as the common electrode 113. An aluminum oxide (AlOx) film was formed as the protective layer 105. The ITO film and the AlOx film were formed by a sputtering method and an ALD method, respectively.

A step is generated at an end portion of each of the insulating layer 104 and the interlayer. It was observed from FIG. 17 that the EL layer 112, the common electrode 113, and the protective layer 105 are normally formed without disconnection.

Although not shown in the cross-sectional photograph, the common electrode 113 and the protective layer 105 are each in contact with an inorganic film on the FET side in the vicinity of an end portion of the display panel and more on the outside than an end portion of the interlayer and the end portion of the common electrode 113. In other words, the end portion of the display panel of this example has the structure illustrated in FIG. 9B. With such a structure, the water resistance on the side surface of the display panel can be improved.

REFERENCE NUMERALS

71: pixel portion, 71*a*: pixel portion, 71*b*: pixel portion, 71*c*: pixel portion, 71*d*: pixel portion, 72: region, 72*b*: region. 72*c*: region, 72*d*: region, 73: region, 74: FPC, 74*a*: FPC. 75: connection portion, 78: driver circuit, 79: display region, 101: substrate. 103: insulating layer, 104: insulating layer, 105: protective layer, 107: auxiliary wiring, 108: organic insulating layer, 109: inorganic insulating layer, 110: light-emitting element, 111: pixel electrode, 112: EL layer, 113: common electrode, 114: optical adjustment layer, 121: region, 122: region, 131: coloring layer, 132: light-blocking layer, 141: insulating layer, 201: conductive layer, 202: insulating layer, 203*a*: conductive layer, 203*b*: conductive layer, 204: semiconductor layer, 204*a*: channel formation region, 204*b*: low-resistance region, 205: conductive layer, 206*a*: insulating layer, 206*b*: insulating layer, 207: insulating layer, 208: insulating layer, 210*a*: transistor, 210*b*: transistor, 211: insulating layer, 212: insulating layer, 213: insulating layer, 214*a*: channel formation region, 214*b*: low-resistance region, 214*c*: LDD region, 220: transistor, 224: semiconductor layer, 225: impurity semiconductor layer, 226: insulating layer, 230: transistor, 231: display region, 231B: display region, 233: control circuit. 234: decompression circuit, 235: image processing circuit, 238: control portion, 240: transistor. 301: transistor, 302: transistor, 303: transistor, 305: capacitor, 306: connection portion, 307: conductive layer, 308: opening. 311: gate insulating layer, 312: insulating layer, 313: insulating layer, 314: insulating layer, 317: bonding layer, 318: bonding layer, 319: connector, 320: space, 355: conductive layer, 356: conductive layer, 357: conductive layer, 360A: display panel, 360B: display panel. 361: substrate, 363: bonding layer, 365: insulating layer, 367: insulating layer, 370A: display panel, 370B: display panel, 370C: display panel, 371: substrate, 373: bonding layer, 375: insulating layer, 380A: display panel, 380B: display panel, 510: base. 519A: terminal, 519B: terminal. 519C: terminal, 519D: terminal. 520: functional layer, 529A: terminal region. 529B: terminal region. 529C: terminal region, 529D: terminal region, 700: display panel, 702: pixel, 702B: pixel, 770: base, 7000: display portion, 7100: television device, 7101: housing, 7103: stand. 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal This application is based on Japanese Patent Application Serial No. 2017-151255 filed with Japan Patent Office on Aug. 4, 2017 and Japanese Patent Application Serial No. 2018-070647 filed with Japan Patent Office on Apr. 2, 2018, the entire contents of which are hereby incorporated by reference.

The invention claimed is:

1. A display panel comprising:
a light-emitting element;
a first insulating layer;
a protective layer; and
a conductive layer,
wherein the light-emitting element comprises a first electrode, a light-emitting layer, and a second electrode,
wherein the light-emitting element is configured to emit light to the protective layer side,
wherein the first insulating layer comprises a first opening overlapping with the first electrode,
wherein the first insulating layer covers an end portion of the first electrode,
wherein the light-emitting layer overlaps with the first electrode through the first opening,
wherein the second electrode is over the light-emitting layer,
wherein the protective layer is over and in contact with the second electrode,
wherein the protective layer comprises a second opening overlapping with the first insulating layer,
wherein the conductive layer is connected to the second electrode through the second opening,
wherein the second electrode is continuously provided between the light-emitting element and another light-emitting element adjacent thereto, and
wherein a bottom surface of the second electrode is provided below a top surface of the first electrode.

2. The display panel according to claim 1,
wherein thicknesses of the first insulating layer and the protective layer remain substantially the same between the light-emitting element and the other light-emitting element,
wherein the second electrode covers end portions of the light-emitting layer, and
wherein the second electrode covers an end portion of a light-emitting layer of the other light-emitting element.

3. The display panel according to claim 1,
wherein a bottom surface of the conductive layer in contact with the protective layer is provided below a top surface of the second electrode,
wherein the first insulating layer comprises an inorganic insulating layer, and
wherein the light-emitting layer extends beyond end portions of the first electrode.

4. The display panel according to claim 1,
wherein a top surface of the protective layer is provided above an uttermost top surface of the conductive layer,
wherein resistivity of the conductive layer is lower than resistivity of the second electrode,
wherein the second opening does not overlap with the first electrode, and
wherein the conductive layer does not overlap with the light-emitting layer and/or the first electrode in the second opening and in a region surrounding the second opening.

5. The display panel according to claim 1,
wherein the protective layer comprises an inorganic film,
wherein, in an entire region where the conductive layer overlaps the first insulating film, the protective film is not in contact with the first insulating film, and
wherein, in a region between the first electrode of the light-emitting element and a third electrode of the other light-emitting element, a bottom surface of the protective film only contacts a top surface of the second electrode.

6. The display panel according to claim 1,
wherein the protective layer comprises an organic insulating film.

7. The display panel according to claim 1, further comprising a second insulating layer, wherein the second insulating layer is over the conductive layer.

8. The display panel according to claim 7,
wherein the second insulating layer comprises a portion in contact with the protective layer.

9. The display panel according to claim 1,
wherein the first insulating layer comprises a portion in contact with the protective layer.

10. A display panel comprising:
a first substrate;
a transistor;
a light-emitting element;
a first insulating layer;
a first inorganic insulating layer;
a second inorganic insulating layer;
a third inorganic insulating layer;
a protective layer; and
a bonding layer,
wherein the first substrate is flexible,
wherein the transistor overlaps with the first substrate with the first inorganic insulating layer therebetween,
wherein a semiconductor layer of the transistor is between the first inorganic insulating layer and the second inorganic insulating layer,
wherein the light-emitting element is between the second inorganic insulating layer and the protective layer,
wherein the light-emitting element comprises a first electrode, a light-emitting layer, and a second electrode,
wherein the light-emitting element is configured to emit light to the protective layer side,
wherein the first insulating layer comprises a first opening overlapping with the first electrode,
wherein the first insulating layer covers an end portion of the first electrode,
wherein the light-emitting layer overlaps with the first electrode through the first opening,
wherein the second electrode is over the light-emitting layer,
wherein the light-emitting element overlaps with the third inorganic insulating layer with the protective layer therebetween,
wherein the third inorganic insulating layer overlaps with the light-emitting element with the bonding layer therebetween, and
wherein the protective layer is in contact with the second inorganic insulating layer more on an outside of than an end portion of the first insulating layer.

11. The display panel according to claim 10, further comprising a conductive layer,
wherein the protective layer comprises a second opening overlapping with the first insulating layer, and
wherein the conductive layer is connected to the second electrode through the second opening.

12. The display panel according to claim 11, further comprising a second insulating layer,
wherein the second insulating layer is over the conductive layer.

13. The display panel according to claim 12,
wherein the second insulating layer comprises a portion in contact with the protective layer.

14. A display device comprising:
a first display panel; and
a second display panel,
wherein the first display panel comprises a first display region,
wherein the second display panel comprises a second display region and a visible-light-transmitting region,
wherein the second display region is adjacent to the visible-light-transmitting region,
wherein the first display region comprises a portion overlapping with the visible-light-transmitting region,
wherein the first display region comprises a first light-emitting element, a first insulating layer, a first protective layer, and a first conductive layer,
wherein the first light-emitting element comprises a first electrode, a first light-emitting layer, and a second electrode,
wherein the first light-emitting element is configured to emit light to the first protective layer side,
wherein the first insulating layer comprises a first opening overlapping with the first electrode,
wherein the first insulating layer covers an end portion of the first electrode,
wherein the first light-emitting layer overlaps with the first electrode through the first opening,
wherein the second electrode is over the first light-emitting layer,
wherein the first protective layer is over and in contact with the second electrode,
wherein a bottom surface of the second electrode is provided below or substantially aligned with a top surface of the first insulating layer or below a bottom surface of the first light-emitting layer,
wherein the first protective layer comprises a second opening overlapping with the first insulating layer,
wherein the first conductive layer is connected to the second electrode through the second opening, and
wherein the second electrode covers end portions of the first light-emitting element.

15. The display device according to claim 14,
wherein the second display region comprises a second light-emitting element, a second insulating layer, a second protective layer, and a second conductive layer,
wherein the second light-emitting element comprises a third electrode, a second light-emitting layer, and a fourth electrode,
wherein the second light-emitting element is configured to emit light to the second protective layer side,
wherein the second insulating layer comprises a third opening overlapping with the third electrode,
wherein the second insulating layer covers an end portion of the third electrode,
wherein the second light-emitting layer overlaps with the third electrode through the third opening,
wherein the fourth electrode is over the second light-emitting layer,
wherein the second protective layer is over and in contact with the fourth electrode,
wherein the second protective layer comprises a fourth opening overlapping with the second insulating layer, and
wherein the second conductive layer is connected to the fourth electrode through the fourth opening.

16. The display panel according to claim 14,
wherein thicknesses of the first insulating layer and the first protective layer remain substantially the same between the first light-emitting element and a second light-emitting element,
wherein resistivity of the conductive layer is lower than resistivity of the second electrode,
wherein the second opening does not overlap with the first electrode, and wherein the first conductive layer does not overlap with the first light-emitting layer and/or the first electrode in the second opening and in a region surrounding the second opening.

17. The display panel according to claim 14,
wherein the second electrode covers an end portion of a second light-emitting layer of a second light-emitting element, and
wherein a bottom surface of the first conductive layer in contact with the first protective layer is provided below a top surface of the second electrode.

18. The display panel according to claim 14,
wherein a top surface of the first protective layer is provided above an uttermost top surface of the first conductive layer,
wherein the first insulating layer comprises an inorganic insulating layer, and
wherein the first light-emitting layer extends beyond end portions of the first electrode.

19. The display panel according to claim 14,
wherein the protective layer comprises an inorganic film,
wherein, in an entire region where the first conductive layer overlaps the first insulating film, the first protective film is not in contact with the first insulating film, and
wherein, in a region between the first electrode of the first light-emitting element and a third electrode of a second light-emitting element, a bottom surface of the first protective film only contacts a top surface of the second electrode.

20. The display panel according to claim 14,
wherein the protective layer comprises an organic insulating film, and
wherein the second electrode is continuously provided between the first light-emitting element and a second light-emitting element adjacent thereto.

* * * * *